US012808933B2

(12) United States Patent
Chun et al.

(10) Patent No.: US 12,808,933 B2
(45) Date of Patent: Nov. 24, 2026

(54) MEMORY DEVICE INCLUDING A PLURALITY OF PADS AND METHOD OF DETECTING CRACK OF PADS THEREOF

(71) Applicant: Samsung Electronics Co., Ltd., Suwon-si (KR)

(72) Inventors: Dojong Chun, Suwon-si (KR); Jungwook Kim, Suwon-si (KR); Minsu Park, Suwon-si (KR); Ji-Suk Kwon, Suwon-si (KR); Seokjae Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 273 days.

(21) Appl. No.: 18/632,845

(22) Filed: Apr. 11, 2024

(65) Prior Publication Data

US 2024/0402248 A1 Dec. 5, 2024

(30) Foreign Application Priority Data

May 31, 2023 (KR) ........................ 10-2023-0069811
Oct. 5, 2023 (KR) ........................ 10-2023-0132381

(51) Int. Cl.

*G01R 31/317* (2006.01)
*H01L 21/66* (2006.01)
*H10P 74/00* (2026.01)

(52) U.S. Cl.

CPC ...... *G01R 31/31725* (2013.01); *H10P 74/273* (2026.01)

(58) Field of Classification Search

CPC .. G01R 31/28; G01R 31/2884; G01R 31/317; G01R 31/31725; G01R 31/3187; H10P 74/27; H10P 74/273; G11C 29/04; G11C 29/08; G11C 29/12; G11C 29/1201; G11C 29/12015; G11C 29/50
See application file for complete search history.

(56) References Cited

U.S. PATENT DOCUMENTS 7,250,311 B2 7/2007 Aoki et al.
11,018,096 B2 5/2021 Sabouret et al.
11,424,358 B2 8/2022 Weyers et al.
(Continued)

FOREIGN PATENT DOCUMENTS

JP 4967924 B2 7/2012
JP 5370250 B2 12/2013
(Continued)

*Primary Examiner* — Huy Q Phan
*Assistant Examiner* — David B Frederiksen
(74) *Attorney, Agent, or Firm* — Harness, Dickey & Pierce, P.L.C.

(57) ABSTRACT

Disclosed is a memory device. The memory device includes a memory cell array; a first pad configured to receive a command from an external device; a second pad configured to exchange data with the external device; a third pad; test logic configured to generate a test pulse signal based on a test command received through the first pad; and a crack detection structure formed below the third pad and configured to include lines connected in series from the test logic to the second pad. A crack occurring in the third pad is detected based on a delay of a delay pulse signal changed when the test pulse signal passes through the crack detection structure.

20 Claims, 25 Drawing Sheets

(56) References Cited

U.S. PATENT DOCUMENTS

| | | | | |
|---|---|---|---|---|
| 2007/0257353 | A1* | 11/2007 | Park | G01R 31/2884<br>324/762.01 |
| 2017/0103929 | A1* | 4/2017 | Lee | H10P 74/277 |
| 2017/0125360 | A1* | 5/2017 | Lee | H10W 42/00 |
| 2017/0256504 | A1* | 9/2017 | Minami | H10W 42/121 |
| 2019/0265291 | A1* | 8/2019 | Kwon | G01R 31/11 |
| 2020/0091021 | A1* | 3/2020 | Lee | H10P 74/273 |
| 2020/0103462 | A1* | 4/2020 | Periyannan | G01R 31/2884 |
| 2021/0229432 | A1* | 7/2021 | Linn | B41J 2/04546 |
| 2021/0311104 | A1* | 10/2021 | Roh | G01R 31/2607 |

FOREIGN PATENT DOCUMENTS

| | | | |
|---|---|---|---|
| JP | 5540854 | B2 | 7/2014 |
| JP | 2016-076629 | A | 5/2016 |

* cited by examiner

MEMORY DEVICE INCLUDING A PLURALITY OF PADS AND METHOD OF DETECTING CRACK OF PADS THEREOF

CROSS-REFERENCE TO RELATED APPLICATIONS

This application claims priority under 35 U.S.C. § 119 to Korean Patent Application No. 10-2023-0069811 filed on May 31, 2023 and Korean Patent Application No. 10-2023-0132381 filed on Oct. 5, 2023, in the Korean Intellectual Property Office, the disclosures of which are incorporated by reference herein in their entireties.

BACKGROUND

1. Field

Various example embodiments of the present inventive concepts described herein relate to a semiconductor memory device, and more particularly, relate to a memory device including a plurality of pads and a method of detecting pad cracks thereof.

2. Description of Related Art

A semiconductor memory may be mainly classified as a volatile memory or a non-volatile memory. Read and write speeds of the volatile memory (for example, a DRAM or an SRAM) are fast, but the data stored in the volatile memory disappears when a power is turned off. In contrast, the non-volatile memory may retain data even when the power is turned off. Therefore, the non-volatile memory may be used to store contents that must be preserved regardless of whether power is supplied or not.

A semiconductor memory may include a plurality of pads which are exposed to an outside when forming a package. The plurality of pads may be stressed by various causes such as probes or wire bonding when testing the semiconductor memory. When a crack occurs in one of the pads due to various stresses, operations of the semiconductor memory may be affected.

SUMMARY

Various example embodiments of the present inventive concepts provide a memory device and a pad crack detection method of arranging a crack detection structure below pads included in the memory device and checking whether cracks have occurred in the pads based on a delay of a pulse signal transmitted to the crack detection structure.

Some example embodiments of inventive concepts provide a memory device is including a memory cell array; a first pad configured to receive a command from an external device; a second pad configured to exchange data with the external device; a third pad; a test logic configured to generate a test pulse signal based on a test command received through the first pad; and a crack detection structure arranged below the third pad and configured to include lines connected in series from the test logic to the second pad. A crack occurring in the third pad is detected based on a delay of a delay pulse signal changed when the test pulse signal passes through the crack detection structure.

Some example embodiments of inventive concepts provide a method of detecting cracks in a memory device, the method including: transmitting a test command from a test device to the memory device; generating a test pulse signal based on the test command; transmitting the test pulse signal through a crack detection structure arranged below a test target pad; outputting a delay pulse signal which has passed through the crack detection structure to the test device through a data pad of the memory device; and comparing the test pulse signal and the delay pulse signal to determine whether the test target pad contains a crack based on a delay of the delay pulse signal.

Some example embodiments of inventive concepts provide a memory device including test target pads; a test logic configured to generate a test pulse signal based on a test command received from an external device; a crack detection structure arranged below the test target pads and including lines connected in series across the test target pads; and a crack detection circuit configured to determine whether cracks occur in the test target pads based on a delay of a delay pulse signal changed when the test pulse signal passes through the crack detection structure.

BRIEF DESCRIPTION OF THE FIGURES

The above and other objects and features of the present inventive concepts will become apparent by describing in detail some example embodiments thereof with reference to the accompanying drawings.

DETAILED DESCRIPTION

Figure 1:
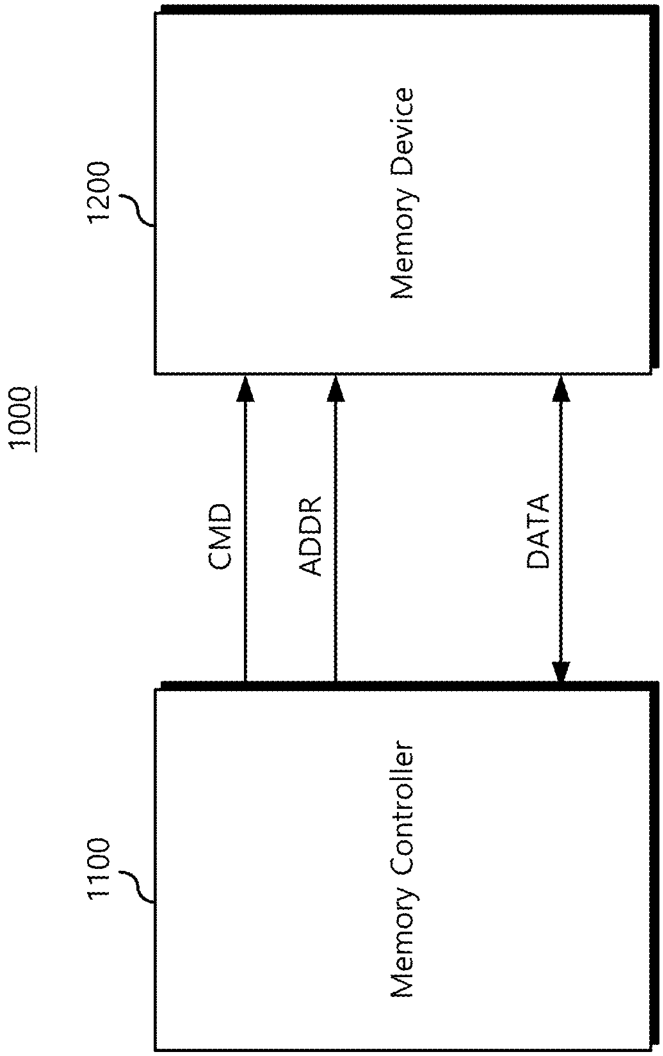
FIG. 1 is a block diagram illustrating a memory system according to an example embodiment.

Below, various example embodiments of the present inventive concepts will be described in detail and clearly to such an extent that one of ordinary skill in the art may easily implement the present inventive concepts.

Below, a DRAM will be used as an example for illustrating features and functions of the present inventive concepts. However, other features and performances may be easily understood from information disclosed herein by a person of ordinary skill in the art. The present inventive concepts may be implemented by other embodiments or applied thereto. Further, the detailed description may be modified or changed according to viewpoints and applications without escaping from the scope, spirit, and other objects of the present inventive concepts.

As described herein, an element that is "on" another element may be above or beneath or adjacent (e.g., horizontally adjacent) to the other element. An element that is on another element may be directly on the other element, such that the element is in direct contact with the other element. An element that is on another element may be indirectly on the other element, such that the element is isolated from direct contact with the other element by one or more interposing spaces and/or structures.

It will be understood that elements and/or properties thereof (e.g., structures, surfaces, directions, or the like), which may be referred to as being "perpendicular," "parallel," or the like with regard to other elements and/or properties thereof (e.g., structures, surfaces, directions, or the like) may be "perpendicular," "parallel," or the like or may be "substantially perpendicular," "substantially parallel," respectively, with regard to the other elements and/or properties thereof.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

When the terms "about" or "substantially" are used in this specification in connection with a numerical value, it is intended that the associated numerical value includes a manufacturing or operational tolerance (e.g., +10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes.

FIG. 1 is a block diagram illustrating a memory system according to an example embodiment. Referring to FIG. 1, a memory system 1000 may include a memory controller 1100 and a memory device 1200.

In some an example embodiments, the memory controller 1100 may perform an access operation of writing data to the memory device 1200 or reading data stored in the memory device 1200. For example, the memory controller 1100 may generate a command CMD and an address ADDR for writing data to the memory device 1200 or reading data stored in the memory device 1200. The memory controller 1100 may include at least one of a control circuit controlling the memory device 1200, a system-on-chip (SoC) such as an application processor (AP), a central processing unit (CPU), a digital signal processor (DSP), and a graphics processing unit (GPU), but example embodiments are not limited thereto.

In some example embodiments, the memory controller 1100 may provide various signals to the memory device 1200 to control an overall operation of the memory device 1200. For example, the memory controller 1100 may control memory access operations of the memory device 1200 such as a read operation and a write operation. The memory controller 1100 may provide the command CMD and the address ADDR to the memory device 1200 to write data DATA in the memory device 1200 or to read data DATA from the memory device 1200.

In some example embodiments, the memory controller 1100 may generate various types of commands CMD to control the memory device 1200. For example, the memory controller 1100 may generate a bank request corresponding to a bank operation of changing a state of a memory bank, among memory banks, to read or write data DATA. As an example, the bank request may include an active request for changing a state of a memory bank, among the memory banks, to an active state. The memory device 1200 may activate a row included in the memory bank, for example, a wordline, in response to the active request. The bank request may include a precharge request for changing the memory banks from an active state to a standby state after reading or writing of data DATA is completed. In addition, the memory controller 1100 may generate an input/output (I/O) request (for example, a column address strobe (CAS) request) for the memory device 1200 to perform a read operation or a write operation of data DATA. As an example, the I/O request may include a read request for reading data DATA from activated memory banks. The I/O request may include a write request for writing data DATA in the activated memory banks. The memory controller 1100 may generate a refresh command to control a refresh operation on the memory banks. However, the types of commands CMD described herein are merely exemplary, and other types of commands CMD may be present.

In some example embodiments, the memory device 1200 may output data DATA, requested to be read by the memory controller 1100, to the memory controller 1100 or may store data DATA, requested to be written by the memory controller 1100, in a memory cell of the memory device 1200. The memory device 1200 may input and output data DATA based on the command CMD and the address ADDR. The memory device 1200 may include memory banks.

The memory device 1200 may be a volatile memory device such as a dynamic random access memory (DRAM), a synchronous dynamic random access memory (SDRAM), a double data rate (DDR) DRAM, a DDR SDRAM, a low-power double data rate (LPDDR) SDRAM, a graphics double data rate (GDDR) SDRAM, a Rambus dynamic random access memory (RDRAM), and a static random access memory (SRAM), or the like. Alternatively or additionally, the memory device 1200 may be implemented as a nonvolatile memory device such as a resistive RAM (RRAM), a phase change memory (PRAM), a magnetoresistive memory (MRAM), a ferroelectric memory (FRAM), a spin-transfer torque RAM (STT-RAM), or the like. In the present specification, some advantages of the present inventive concepts have been described with respect to a DRAM, but example embodiments are not limited thereto.

Figure 2:
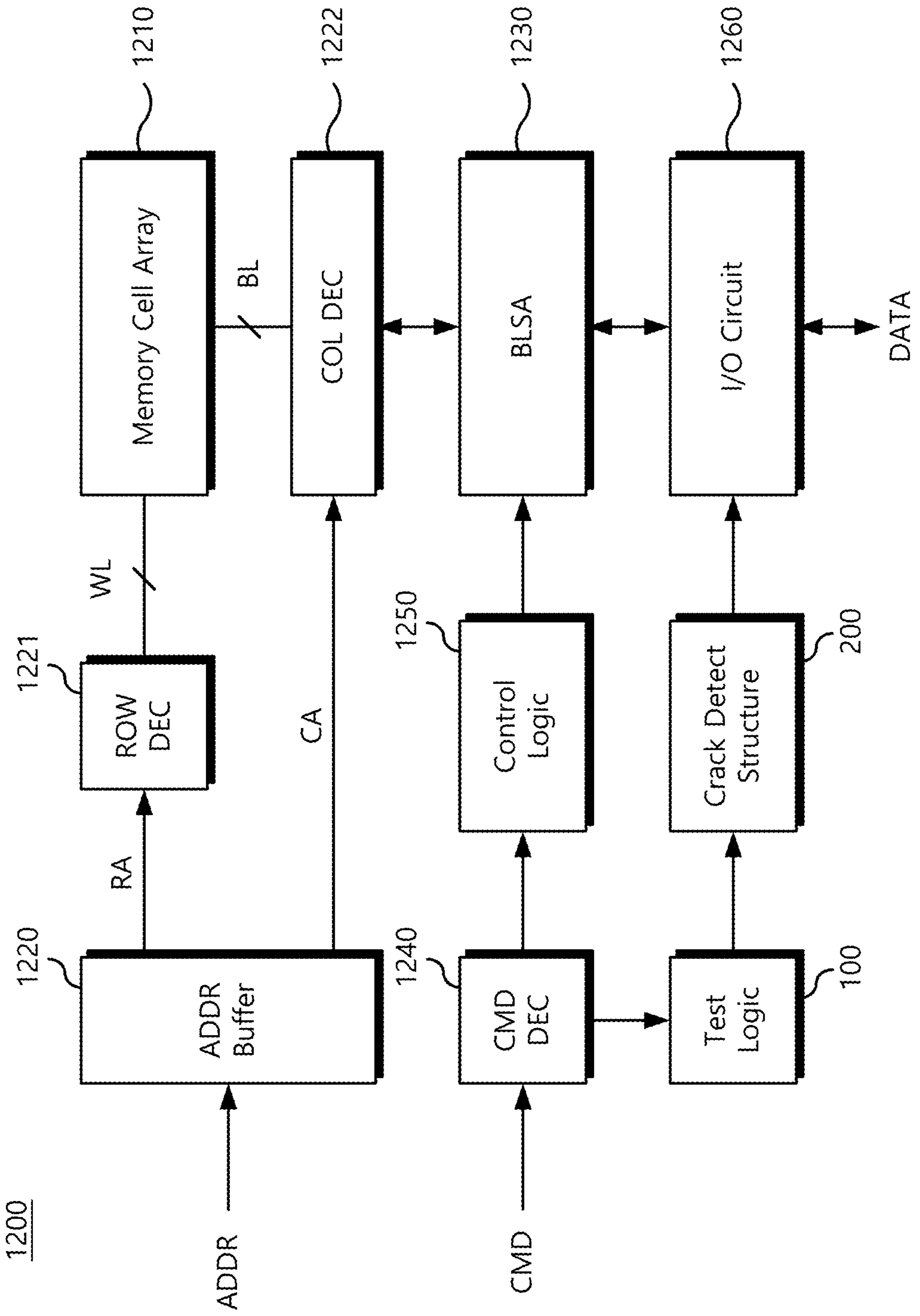
FIG. 2 is a block diagram illustrating a memory device of FIG. 1.

In some example embodiments, the memory banks may include a memory cell array divided in units of banks, a row decoder, a column decoder, a sense amplifier, a write driver, or the like. The memory banks may store data DATA, requested to be written in the memory device 1200, through the write driver and may read data DATA, requested to be read, using the sense amplifier. The memory banks may further include a component for a refresh operation of storing and maintaining data in the cell array, or select circuits based on an address. FIG. 2 is a block diagram illustrating a memory device of FIG. 1. Referring to FIG. 2, the memory device 1200 may include a memory cell array 1210, an address buffer 1220, a row decoder 1221, a column decoder 1222, a bitline sense amplifier 1230, a command decoder 1240, control logic 1250 and an input/output circuit 1260. In addition, the memory device 1200 may include test logic 100 and a crack detection structure 200 to detect cracks in a plurality of pads included in the memory device 1200.

In some example embodiments, the memory cell array 1210 may include a plurality of memory cells arranged in a matrix of rows and columns. For example, the memory cell array 1210 may include a plurality of wordlines WL and a plurality of bitlines BL connected to memory cells. The plurality of wordlines WL may be connected to rows of the memory cells, and the plurality of bitlines BL may be connected to columns of the memory cells.

In some example embodiments, the address buffer 1220 may receive an address ADDR from the memory controller 1100 of FIG. 1. For example, the address ADDR may include a row address RA addressing a row of the memory cell array 1210 and a column address CA addressing a column of the memory cell array 1210. The address buffer 1220 may transmit the row address RA to the row decoder 1221 and may transmit the column address CA to the column decoder 1222.

In some example embodiments, the row decoder 1221 may select one of the plurality of wordlines WL connected to the memory cell array 1210. The row decoder 1221 may decode the row address RA, received from the address buffer 1220, to select a single wordline corresponding to the row address RA and may activate the selected wordline.

In some example embodiments, the column decoder 1222 may select a predetermined (or desired) bitline from among the plurality of bitlines BL of the memory cell array 1210. The column decoder 1222 may decode the column address CA, received from the address buffer 1220, to select the predetermined (or desired) bitline BL corresponding to the column address CA.

In some example embodiments, the bitline sense amplifier 1230 may be connected to the bitlines BL of the memory cell array 1210. For example, the bitline sense amplifier 1230 may sense a change in voltage of a selected bitline, among the plurality of bitlines BL, and may amplify and output the change in voltage.

In some example embodiments, the command decoder 1240 may decode a write enable signal /WE, a row address strobe signal /RAS, a column address strobe signal /CAS, and a chip select signal /CS received from the memory controller 1100 such that control signals corresponding to the command CMD are generated in the control logic 1250. The command CMD may include an active request, a read request, a write request, or a precharge request.

The control logic 1250 may control an overall operation of the bitline sense amplifier 1230 through the control signals corresponding to the command CMD. The control logic 1250 may generate control signals such that the bitline sense amplifier 1230 operates as a single-ended sense amplifier. Additionally, the control logic 1250 may control an overall operation of the memory device 1200.

In some example embodiments, the input/output circuit 1260 may output data DATA to the memory controller 1100 through data pad based on a sensed and amplified voltage from the bitline sense amplifier 1230. For example, the input/output circuit 1260 may include an input buffer or an output buffer. The input buffer or the output buffer may be connected to the data pad. The input/output circuit 1260 may perform a serialization operation or a deserialization operation of data DATA.

In some example embodiments, the test logic 100 may generate a test pulse signal for a pad crack detection operation. For example, the test logic 100 may receive a test enable signal from the command decoder 1240. The test logic 100 may generate the test pulse signal based on the test enable signal. As an example, the test logic 100 may be provided separately from the control logic 1250. As another example, the test logic 100 may be included in control logic 1250.

In some example embodiments, the crack detection structure 200 may be formed under a plurality of pads (hereinafter referred to as test target pads) of the memory device 1200. For example, the crack detection structure 200 may be disposed (or arranged) below the test target pads. The crack detection structure 200 may have various types of line structures. As an example, the crack detection structure 200 may be formed on the same layer as a general signal line. The test pulse signal may pass through the crack detection structure 200 and be output through the input/output circuit 1260 and the data pad.

Figure 3:
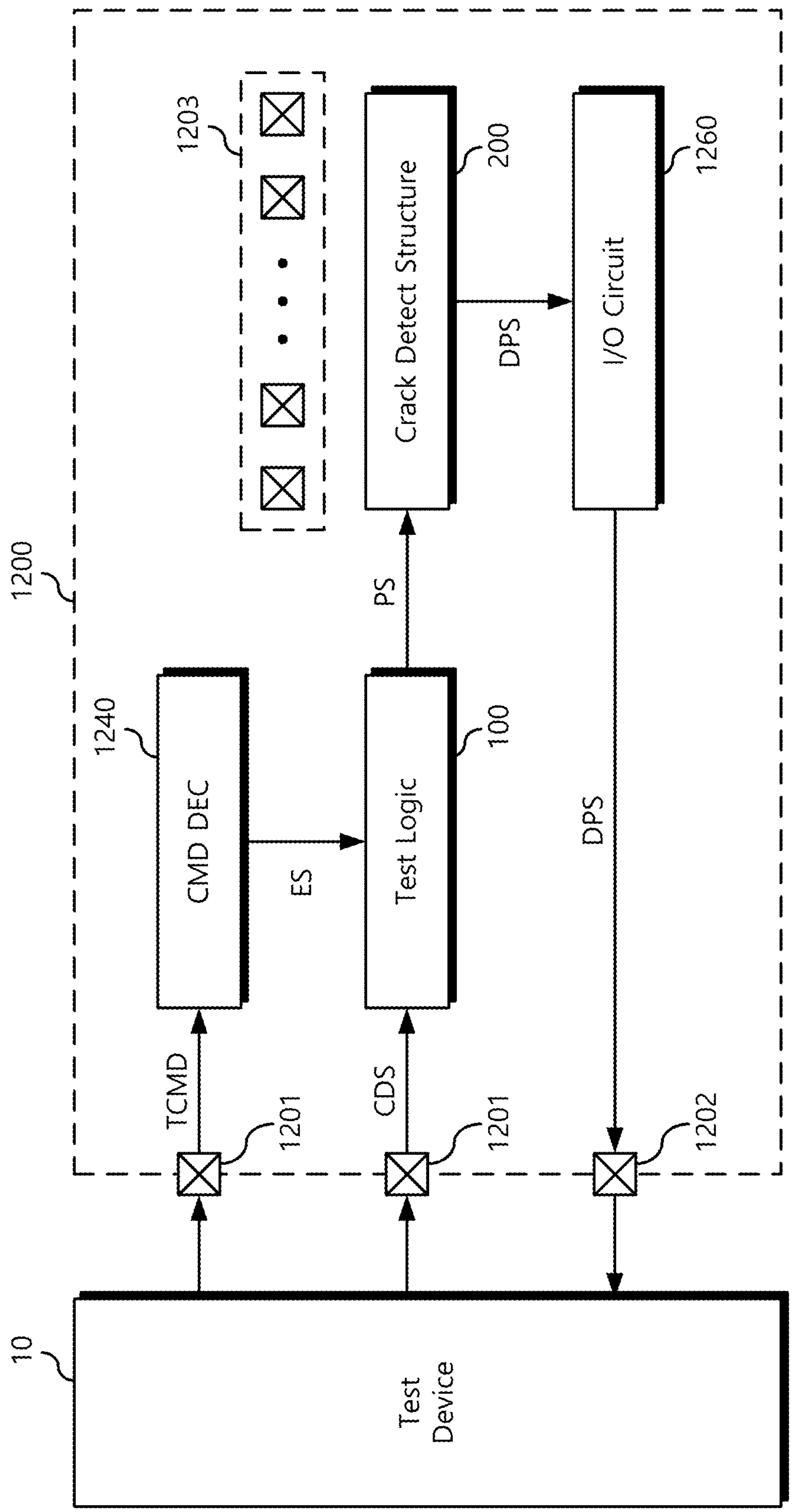
FIG. 3 is a block diagram illustrating a crack detection operation of test target pads included in a memory device of FIG. 2.

FIG. 3 is a block diagram illustrating a crack detection operation of test target pads included in a memory device of FIG. 2. Referring to FIG. 3, a test device 10 may transmit a test command TCMD to the memory device 1200, receive a response to the test command TCMD, and detect whether test target pads 1203 contain cracks.

In some example embodiments, the test device 10 may transmit a test command TCMD through a command pad 1201. The command decoder 1240 may transmit a test enable signal ES to the test logic 100 when receiving the test command TCMD. In addition, the test device 10 may transmit a crack detection signal CDS with a specified delay through the command pad 1201.

In some example embodiments, when receiving the test enable signal ES, the test logic 100 may generate a test pulse signal PS by combining the test enable signal ES and the crack detection signal CDS. The test pulse signal PS may pass through the crack detection structure 200 and be converted into a delay pulse signal DPS due to resistance of the crack detection structure 200. As an example, the delay pulse signal DPS may be transmitted to the test device 10 through the input/output circuit 1260 and a data pad 1202. As another example, the delay pulse signal DPS may be transmitted directly to the test device 10 through the data pad 1202. In some example embodiments, the test device 10 may compare the test pulse signal PS and the delay pulse signal DPS to determine whether any of the test target pads 1203 include cracks. For example, the test device 10 may check a normal distribution corresponding to the delay pulse signal DPS having a specified distribution. In some example embodiments, when a delay value of the received delay pulse signal DPS deviates from the normal distribution, the test device 10 may determine which the test target pads 1203 contain cracks. In some example embodiments, when the delay value deviates from the normal distribution, it may mean that the delay value differs from the average of the normal distribution by more than a certain level (for example, a predetermined multiple of standard deviation of the normal distribution). As an example, the test device 10 may determine which the test target pads 1203 contain cracks when the delay value of the received delay pulse signal DPS deviates from the average of the normal distribution by a specified size or more.

Figure 4:
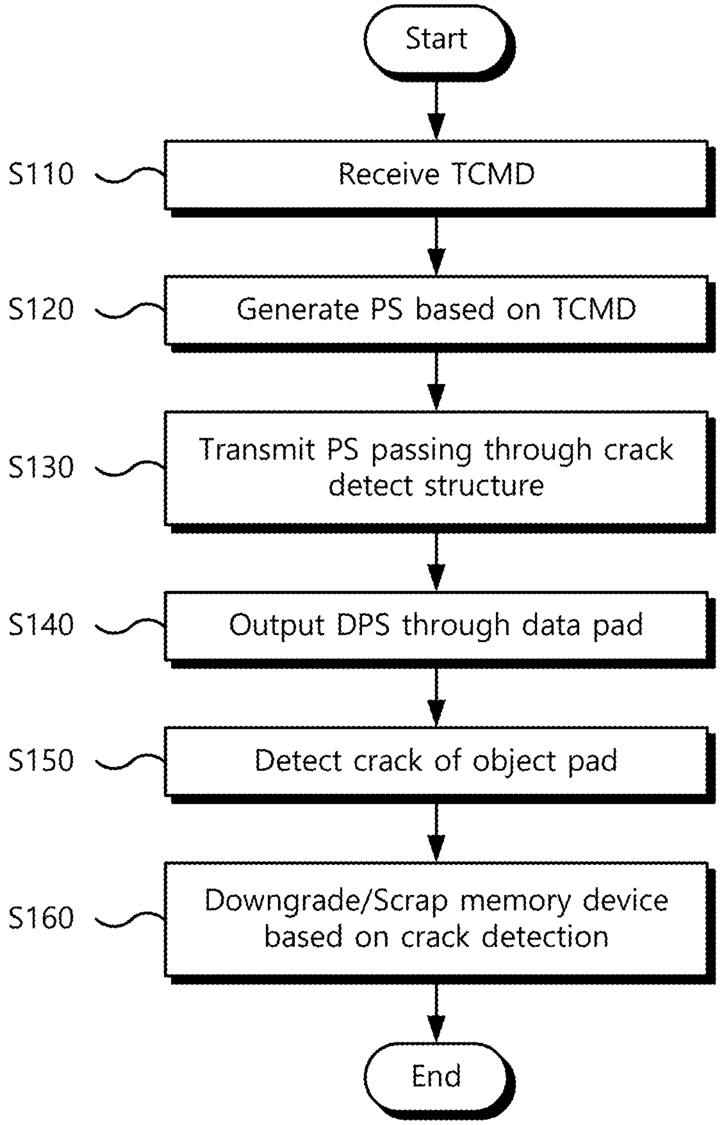
FIG. 4 is a flowchart illustrating a method of detecting pad cracks in a memory device of FIG. 3.
Figure 5:
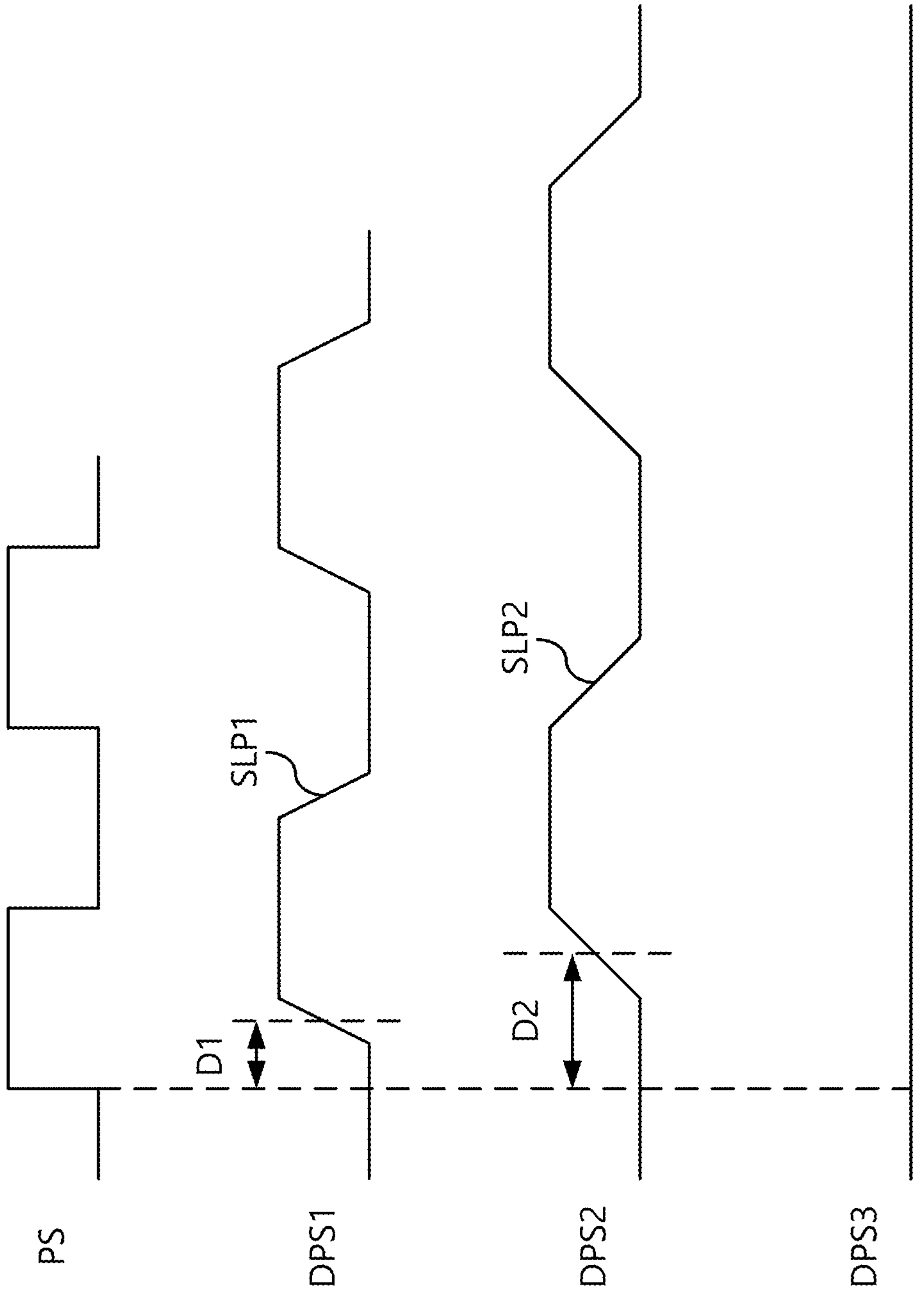
FIG. 5 is a diagram illustrating delay pulse signals obtained when performing a method of detecting pad cracks of FIG. 4.

FIG. 4 is a flowchart illustrating a method of detecting pad cracks in a memory device of FIG. 3. FIG. 5 is a diagram illustrating delay pulse signals obtained when performing a method of detecting pad cracks of FIG. 4. Referring to FIGS. 3 to 5, the test device 10 may compare a test pulse signal PS and a delay pulse signal DPS to determine whether any of the test target pads 1203 contain cracks.

In some example embodiments, in operation S110, the memory device 1200 may receive a test command TCMD from the test device 10. For example, the test command TCMD may be received through the command pad 1201 of the memory device 1200.

In some example embodiments, in operation S120, the memory device 1200 may generate a test pulse signal PS based on the test command TCMD. For example, the memory device 1200 may receive a crack detection signal CDS with a specified delay through the command pad 1201. The command decoder 1240 may transmit a test enable signal ES to the test logic 100 when receiving the test command TCMD. In some example embodiments, when receiving the test enable signal ES, the test logic 100 may output a test pulse signal PS by combining the test enable signal ES and the crack detection signal CDS. As an example, the test pulse signal PS may include at least one pulse generated according to a specified period.

In some example embodiments, in operation S130, the memory device 1200 may transmit the test pulse signal PS through the crack detection structure 200. For example, the crack detection structure 200 may be formed under the test target pads 1203. The crack detection structure 200 may be connected in series between the test logic 100 and the input/output circuit 1260. The test pulse signal PS may be delayed while passing through the crack detection structure 200. Accordingly, a delay pulse signal DPS may be output from the end of the crack detection structure 200.

In some example embodiments, in operation S140, the memory device 1200 may output the delay pulse signal DPS to the test device 10 through the data pad 1202. As an example, the delay pulse signal DPS may be output to the data pad 1202 through the input/output circuit 1260. As another example, the delay pulse signal DPS may be output directly from the end of the crack detection structure 200 to the data pad 1202.

In some example embodiments, in operation S150, the test device 10 may check whether the test target pads 1203 contain cracks based on the delay pulse signal DPS. For example, the test device 10 may store information of the test pulse signal PS. The test device 10 may compare the test pulse signal PS and the delay pulse signal DPS. The test device 10 may confirm a normal distribution corresponding to a delay pulse signal DPS having a specified distribution. In some example embodiments, when a delay value of the received delay pulse signal DPS deviates from the normal distribution, the test device 10 may determine which the test target pads 1203 contain cracks. In some example embodiments, when the delay value deviates from the normal distribution, it may mean that the delay value differs from the average of the normal distribution by more than a certain level (for example, a predetermined multiple of the standard deviation of the normal distribution). As an example, the test device 10 may determine which the test target pads 1203 contain cracks when the delay value of the received delay pulse signal DPS deviates from the average of the normal distribution by a specified size or more.

In some example embodiments, even when the test target pads 1203 are normal (or there are no cracks in the test target pads 1203), the test pulse signal PS may pass through the crack detection structure 200 and be basically delayed by resistance. For example, when the test target pads 1203 are normal (or there are no cracks in the test target pads 1203), the test pulse signal PS may be changed to the first delay pulse signal DPS1 in FIG. 5. The first delay pulse signal DPS1 may have a first delay D1 from the test pulse signal PS. The first delay pulse signal DPS1 may have a first edge slope SLP1.

In some example embodiments, when a crack occurs in the test target pads 1203, the test pulse signal PS may be delayed according to a resistance, which is caused by the crack, greater than the resistance of the crack detection structure 200. For example, when a crack occurs in the test target pads 1203, the test pulse signal PS may be changed to the second delayed pulse signal DPS2 or the third delayed pulse signal DPS3 of FIG. 5. The second delay pulse signal DPS2 may have a second delay D2 from the test pulse signal PS. The second delay pulse signal DPS2 may have a second edge slope SLP2. In some example embodiments, when at least one of the test target pads 1203 is poorly connected (or defectively connected) due to the crack, the delay pulse signal, such as the third delay pulse signal DPS3, may not be received.

In some example embodiments, when the delay pulse signal DPS has a delay equal to or less than the first delay D1, the test device 10 may determine that the test target pads 1203 are normal (or that there are no cracks in the test target pads 1203). In some example embodiments, when an edge slope of the delay pulse signal DPS is greater than or equal to the first edge slope SLP1, the test device 10 may determine which the test target pads 1203 are normal (or that there are no cracks in the test target pads 1203).

In some example embodiments, when the delay pulse signal DPS has a delay greater than the first delay D1, the test device 10 may determine that there is a crack in the test target pads 1203. In some example embodiments, when the edge slope of the delay pulse signal DPS is smaller than the first edge slope SLP1, the test device 10 may determine that there is a crack in the test target pads 1203.

In some example embodiments, in operation S160, based on a result determined by the test device 10, the memory device may be scrapped or downgraded, leading to an improved yield and/or reliability and/or earlier detection of inoperable parts and/or decrease in fabrication time and/or costs.

Figure 6:
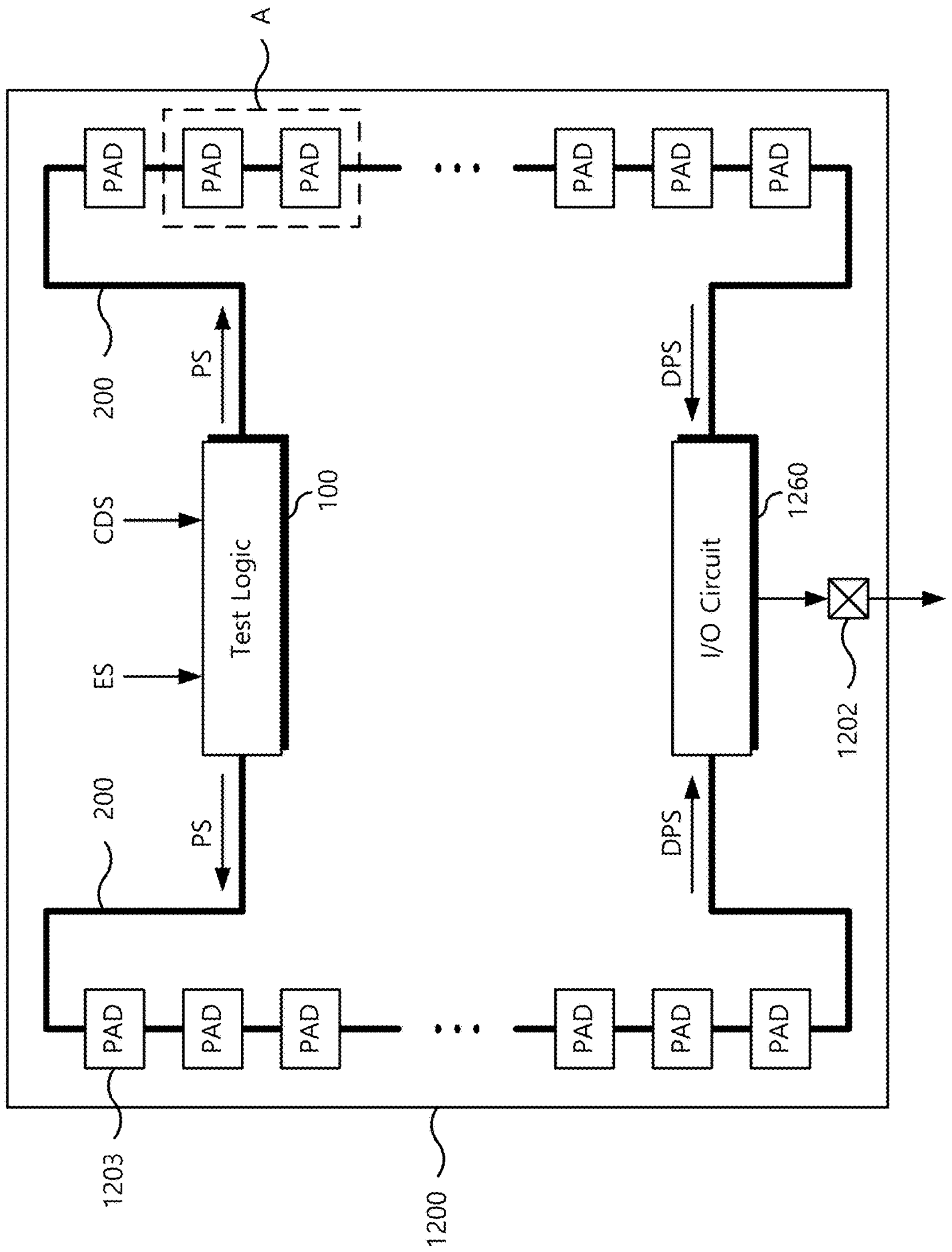
FIG. 6 is a diagram illustrating arrangement relationship between test target pads and a crack detection structure in a memory device of FIG. 2.

FIG. 6 is a diagram illustrating arrangement relationship between test target pads and a crack detection structure in a memory device of FIG. 2. Referring to FIG. 6, the test target pads 1203 may be exposed outside a package of the memory device 1200. The test target pads 1203 may be formed on the uppermost metal layer of the memory device 1200. The crack detection structure 200 may be connected in series from the test logic 100 to the input/output circuit 1260. The crack detection structure 200 may be formed in a metal layer below the test target pads 1203.

In some example embodiments, the test logic 100 may generate a test pulse signal PS based on a test enable signal ES and a crack detection signal CDS. The test pulse signal PS may be transmitted along the crack detection structure 200 and transformed into a delay pulse signal DPS based on resistance of the test target pads 1203. As an example, the delay pulse signal DPS may be output to outside through the input/output circuit 1260 and the data pad 1202. As another example, the delay pulse signal DPS may be output directly to outside (or may be output to outside) through the data pad 1202 without going through the input/output circuit 1260.

Figure 7:
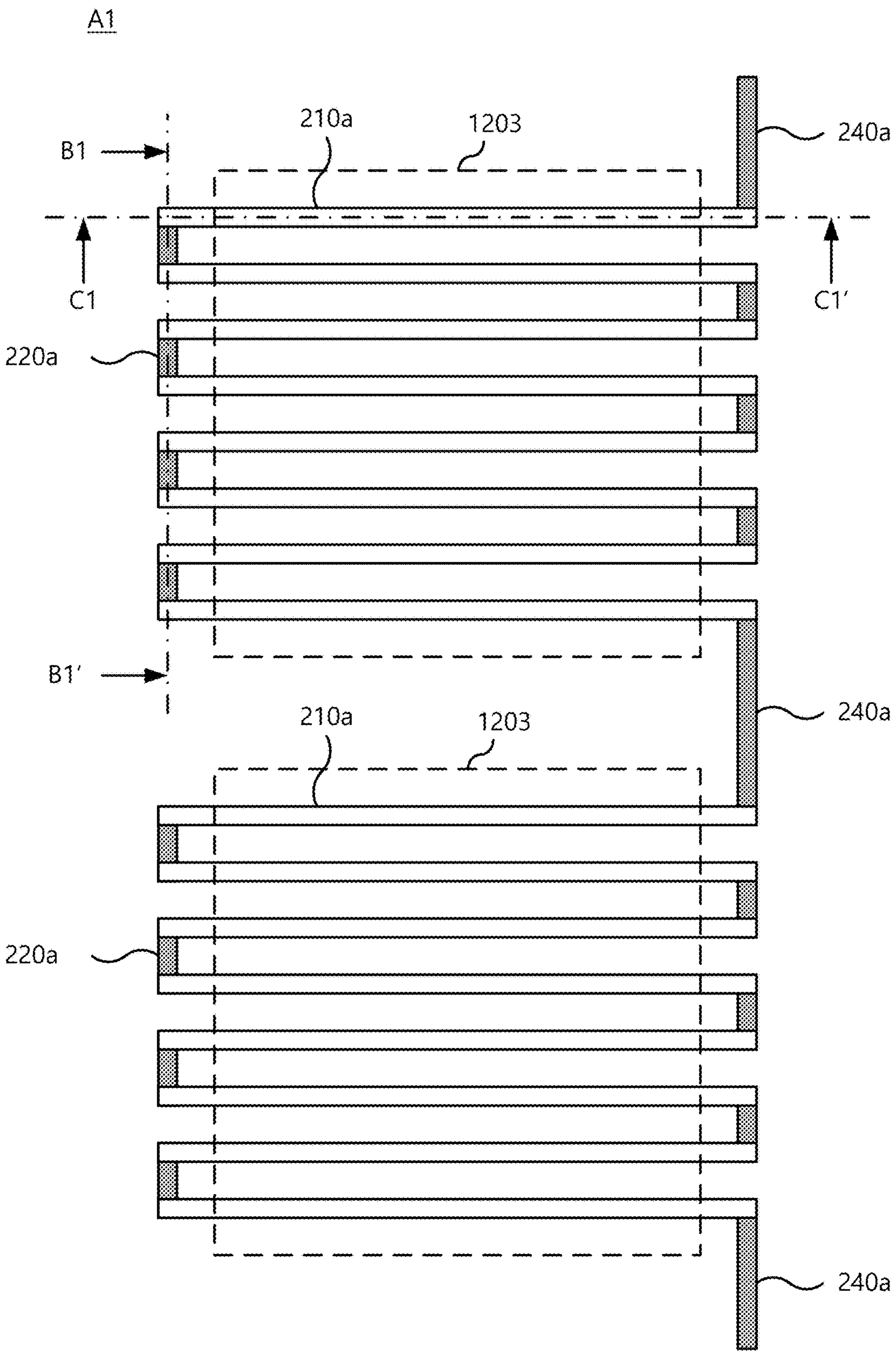
FIG. 7 is a diagram illustrating an example of A in FIG. 6.
Figure 8:
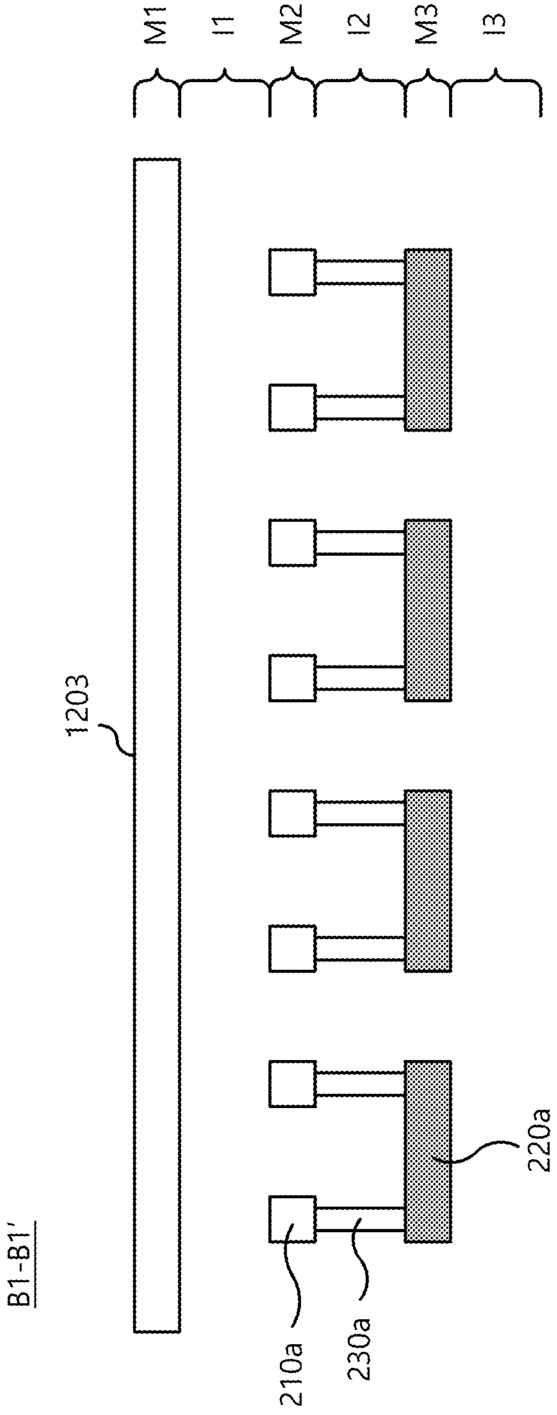
FIG. 8 is a cross section view illustrating according to B1-B1' in FIG. 7.
Figure 9:
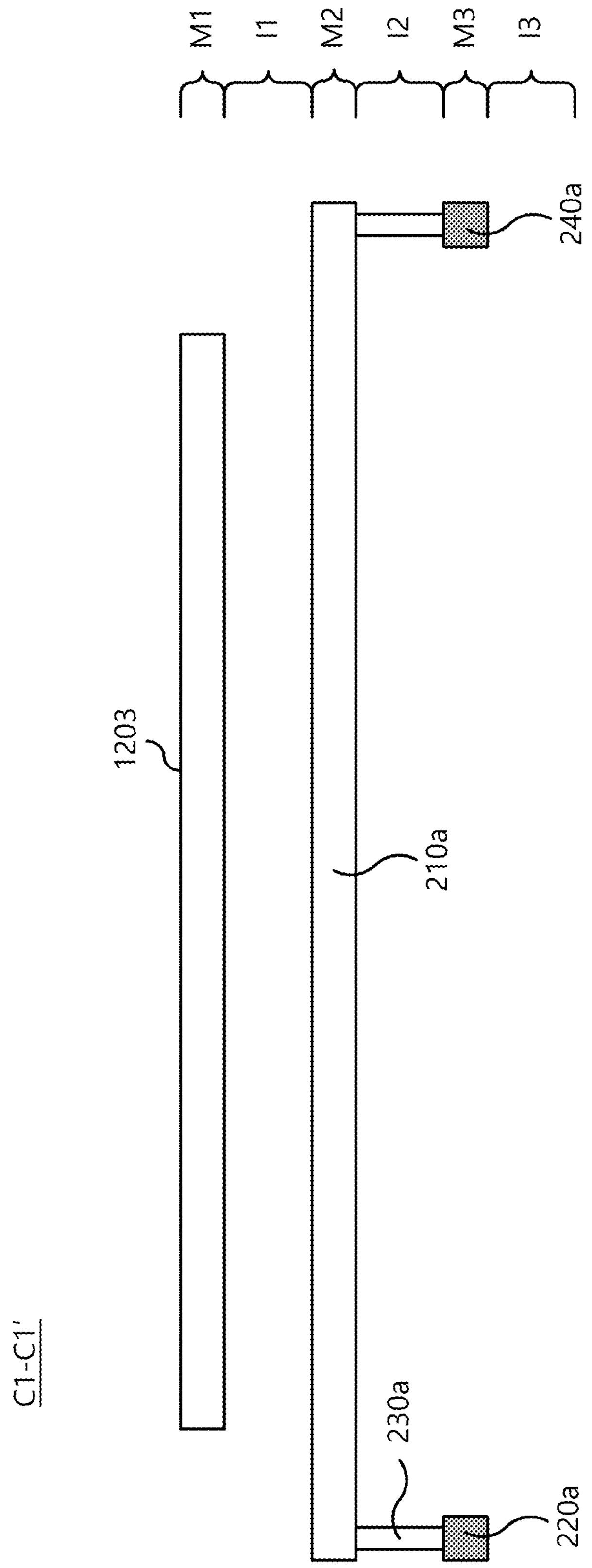
FIG. 9 is a cross section view illustrating according to C1-C1' in FIG. 7.

FIG. 7 is a diagram illustrating an example of A in FIG. 6. FIG. 8 is a cross section view illustrating according to B1-B1' in FIG. 7. FIG. 9 is a cross section view illustrating according to C1-C1' in FIG. 7. Referring to FIGS. 7 to 9, the memory device 1200 may include a first metal layer M1 (for example, the uppermost metal layer), a second metal layer M2 (for example, the first upper metal layer), and a third metal layer M3 (for example, a second upper metal layer). In addition, the memory device 1200 may include a first insulating layer I1 disposed between the first metal layer M1 and the second metal layer M2, a second insulating layer I2 disposed between the second metal layer M2 and the third metal layer M3, and a third insulating layer I3 disposed below the third metal layer M3.

In some example embodiments, the test target pads 1203 may be formed in the first metal layer M1. The test target pads 1203 may be exposed to the outside of the package of the memory device 1200. The crack detection structure 200 may include a plurality of first line portions 210*a* and a plurality of second line portions 220*a*. The plurality of first line portions 210*a* may be formed to cross one of the test target pads 1203 in a first direction.

In some example embodiments, the crack detection structure 200 may include a connection line portion 240*a*. The connection line portion 240*a* may connect the first line portions 210*a* corresponding to different test target pads. As an example, one end of the connection line portion 240*a* may be connected to one of the plurality of first line portions 210*a* corresponding to one test target pad through a via 230*a*. The other end of the connection line portion 240*a* may be connected to one of the plurality of first line portions 210*a* corresponding to another test target pad through a via 230*a*.

In some example embodiments, the plurality of first line portions 210*a* may be formed in the second metal layer M2. The plurality of second line portions 220*a* may be formed in the third metal layer M3. One of the plurality of vias 230*a* may penetrate the second insulating layer I2 to electrically connect one of the plurality of first line portions 210*a* and one of the plurality of second line portions 220*a*.

In some example embodiments, the plurality of first line portions 210*a* may be arranged to be spaced apart from each other at a specified distance. The plurality of first line portions 210*a* may be arranged parallel to each other. One of the plurality of first line portions 210*a* may be formed to be longer than one of the plurality of second line portions 220*a*. The length of one of the plurality of second line portions 220*a* may be set to correspond to a distance at which the plurality of first line portions 210*a* are spaced apart from each other.

In some example embodiments, general lines (for example, lines used to operate the memory device 1200) may also be formed in the second metal layer M2 or the third metal layer M3. The general lines may be formed adjacent to the plurality of first line portions 210*a* or the plurality of second line portions 220*a* so as to pass between the test target pads 1203.

Figure 10:
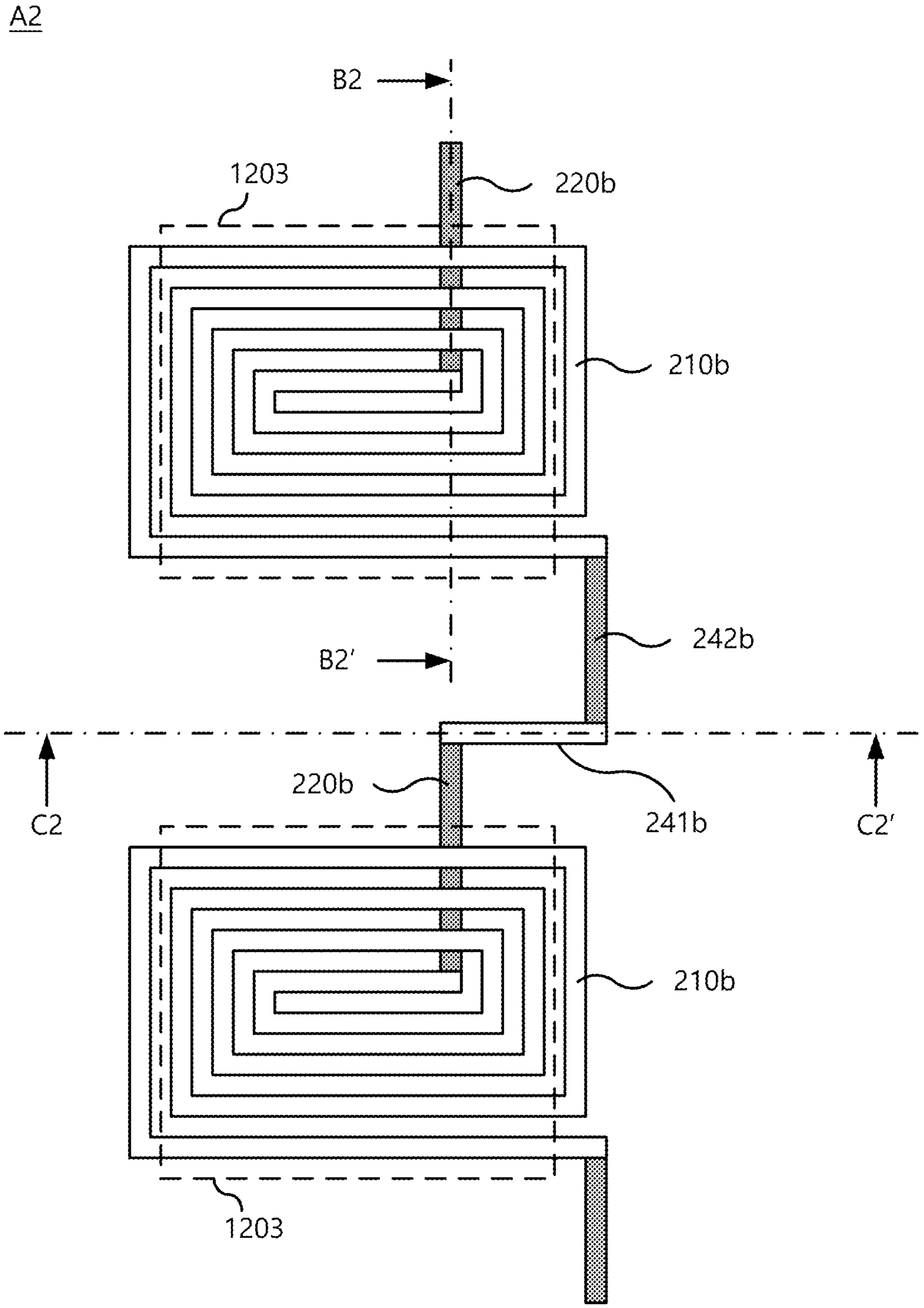
FIG. 10 is a diagram illustrating another example of A in FIG. 6.
Figure 11:
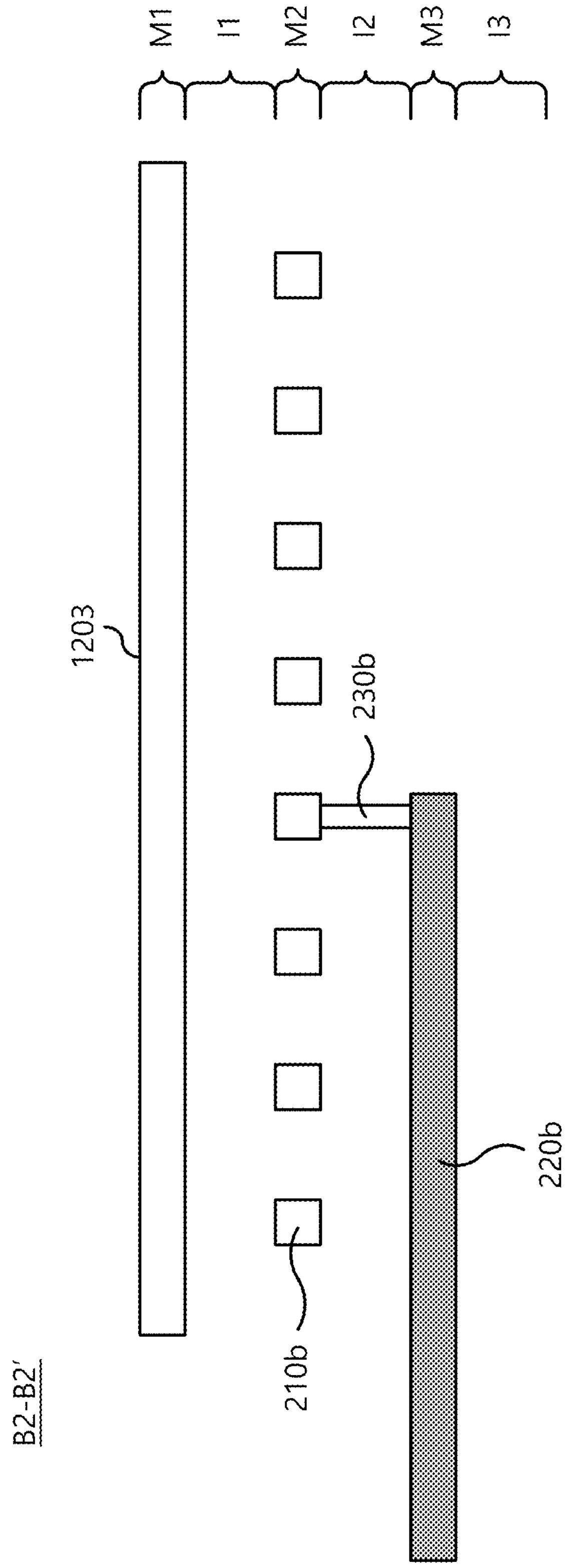
FIG. 11 is a cross section view illustrating according to B2-B2' in FIG. 10.
Figure 12:
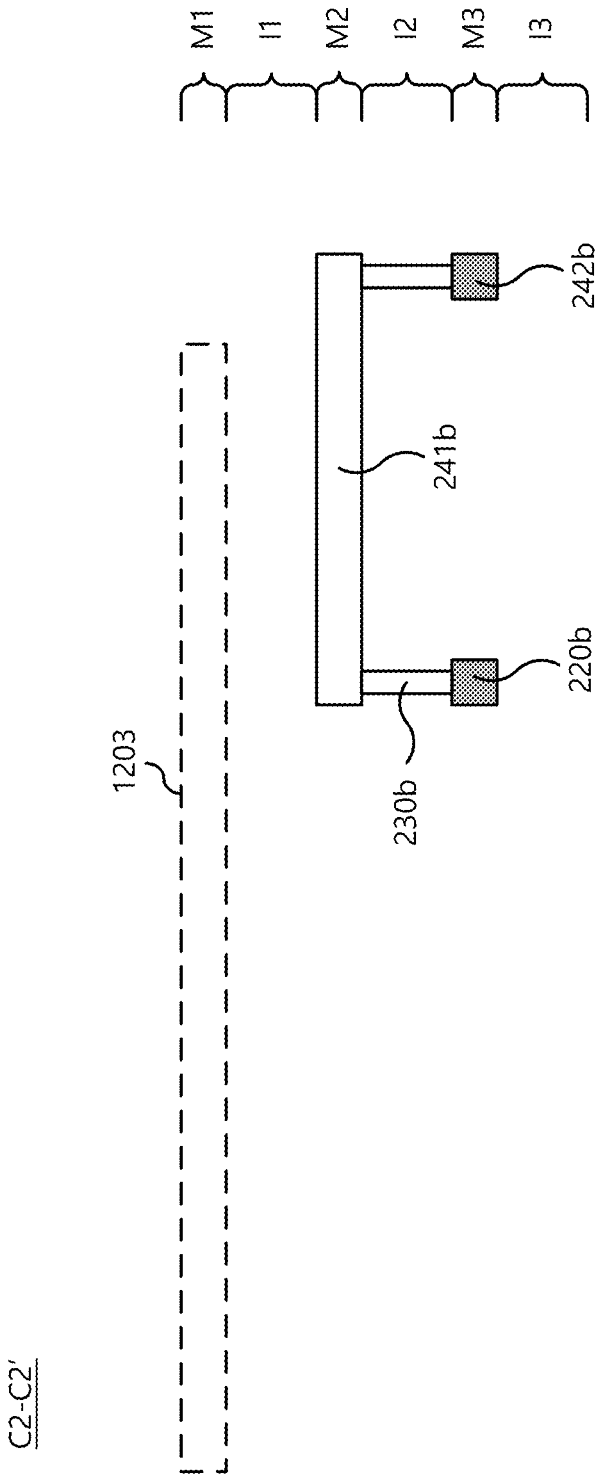
FIG. 12 is a cross section view illustrating according to C2-C2' in FIG. 10.

FIG. 10 is a diagram illustrating another example of A in FIG. 6. FIG. 11 is a cross section view illustrating according to B2-B2' in FIG. 10. FIG. 12 is a cross section view illustrating according to C2-C2' in FIG. 10. Referring to FIGS. 10 to 12, the memory device 1200 may include a first metal layer M1, a second metal layer M2, and a third metal layer M3. In addition, the memory device 1200 may include a first insulating layer I1 disposed between the first metal layer M1 and the second metal layer M2, a second insulating layer I2 disposed between the second metal layer M2 and the third metal layer M3, and a third insulating layer I3 disposed below the third metal layer M3.

In some example embodiments, the test target pads 1203 may be formed in the first metal layer M1. The crack detection structure 200 may include a plurality of first line portions 210*b* and a plurality of second line portions 220*b*. One of the plurality of first line portions 210*b* corresponding to one of the test target pads 1203 may have a form connected as one in the second metal layer M2. One of the plurality of first line portions 210*b* may be formed to have at least one curve so as to vertically overlap one of the test target pads 1203. One end of one of the plurality of first line portions 210*b* may be connected to one of the plurality of second line portions 220*b* through one via 230*b*.

In some example embodiments, the plurality of first line portions 210*b* may be formed in the second metal layer M2. The plurality of second line portions 220*b* may be formed in the third metal layer M3. The via 230*b* may penetrate the second insulating layer I2 and electrically connect some of the first line portions 210*b* and some of the second line portions 220*b*.

In some example embodiments, the crack detection structure 200 may include a first connection portion 241*b* and a second connection portion 242*b*. The first connection portion 241*b* may be formed in the second metal layer M2. The second connection portion 242*b* may be formed in the third metal layer M3. One end of the first connection portion 241*b* may be connected to some of the plurality of second line portions 220*b* through the via 230*b*. The other end of the first connection portion 241*b* may be connected to one end of the second connection portion 242*b* through the via 230*b*. The other end of the second connection portion 242b may be connected to some of the plurality of first line portions 210b through the via 230b.

Figure 13:
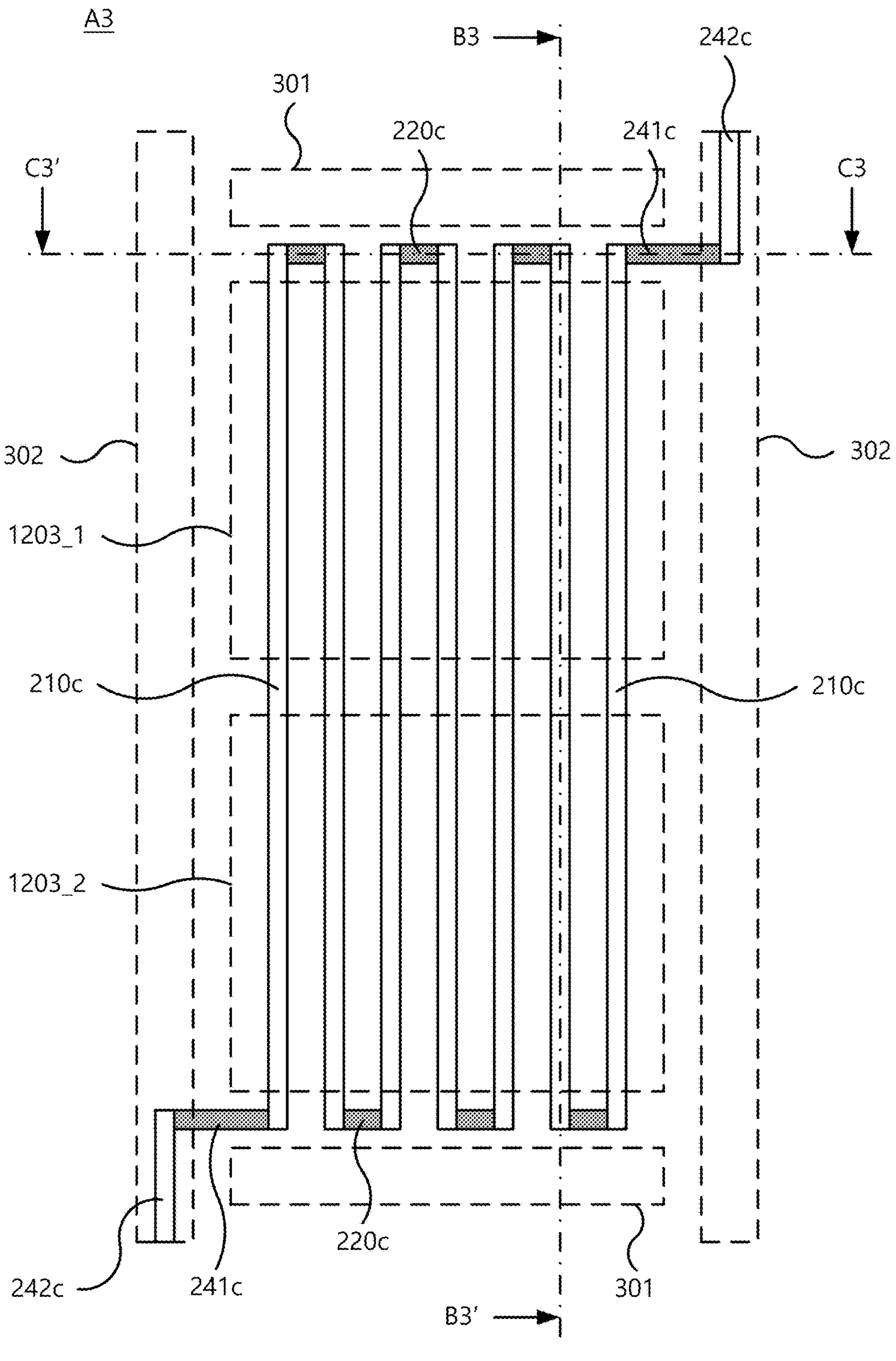
FIG. 13 is a diagram illustrating another example of A in FIG. 6.
Figure 14:
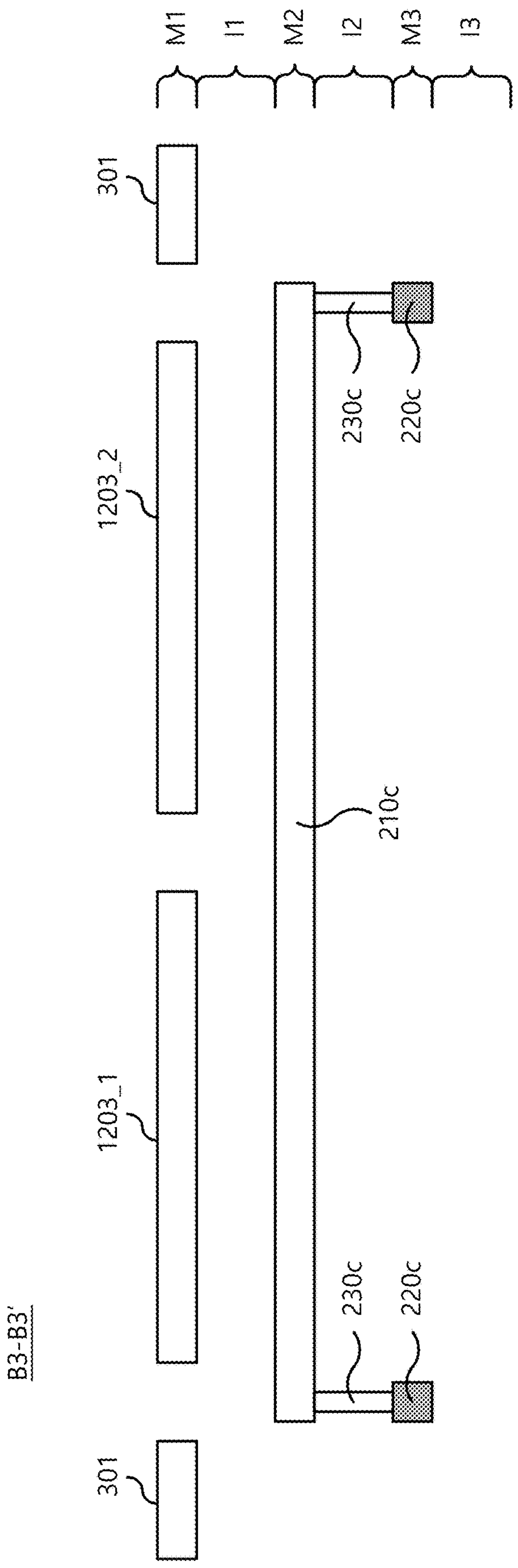
FIG. 14 is a cross section view illustrating according to B3-B3' in FIG. 13.
Figure 15:
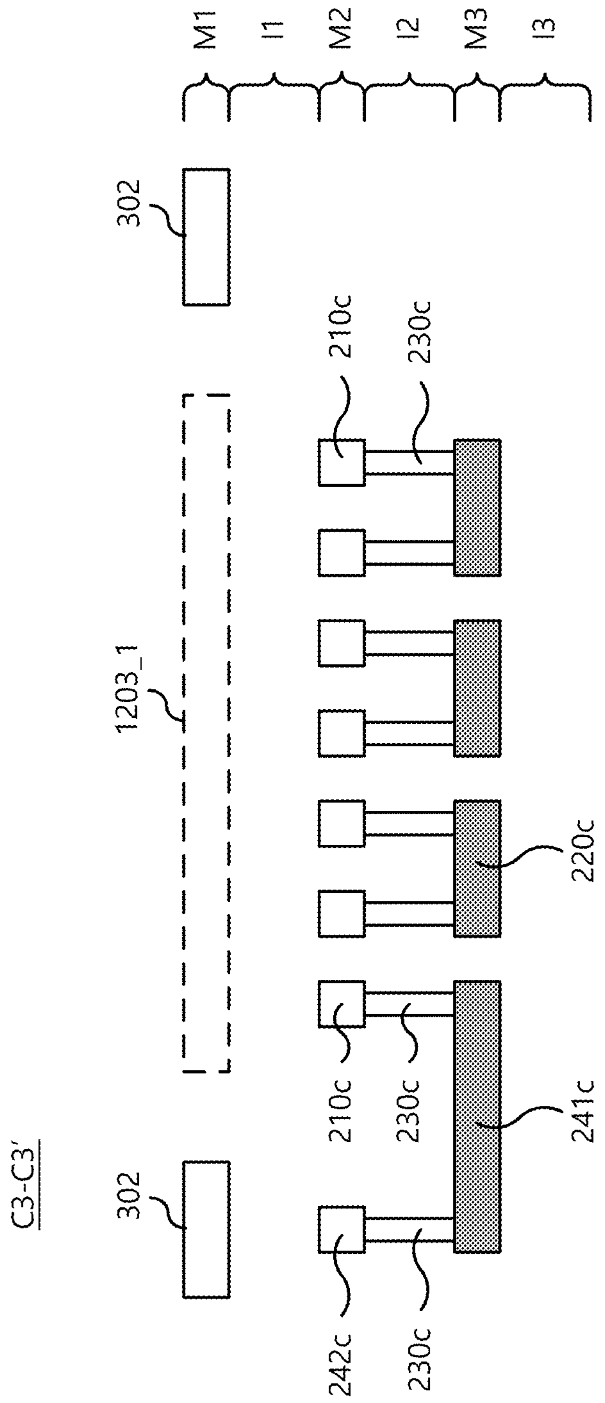
FIG. 15 is a cross section view illustrating according to C3-C3' in FIG. 13.

FIG. 13 is a diagram illustrating another example of A in FIG. 6. FIG. 14 is a cross section view illustrating according to B3-B3' in FIG. 13. FIG. 15 is a cross section view illustrating according to C3-C3' in FIG. 13. Referring to FIGS. 13 to 15, the memory device 1200 may include a first metal layer M1, a second metal layer M2, and a third metal layer M3. In addition, the memory device 1200 may include a first insulating layer I1 disposed between the first metal layer M1 and the second metal layer M2, a second insulating layer I2 disposed between the second metal layer M2 and the third metal layer M3, and a third insulating layer I3 disposed below the third metal layer M3.

In some example embodiments, test target pads 1203_1 and 1203_2 and power buses 301 and 302 may be formed in the first metal layer M1. For example, the power buses 301 and 302 may be formed around the test target pads 1203_1 and 1203_2. The first power buses 301 may be arranged in a first direction between test target pads. The second power buses 302 may be arranged to extend in a second direction in which the test target pads 1203_1 and 1203_2 are arranged. The test target pads 1203_1 and 1203_2 may be exposed to the outside of the package of the memory device 1200.

In some example embodiments, the crack detection structure 200 may include a plurality of first line portions 210c and a plurality of second line portions 220c. The plurality of first line portions 210c may extend in the second direction in which the test target pads 1203_1 and 1203_2 are arranged. The plurality of first line portions 210c may be arranged to be parallel to the second power buses 302. The plurality of second line portions 220c may be disposed between the plurality of first line portions 210c in the first direction. The plurality of second line portions 220c may be arranged to be parallel to the first power buses 301.

In some example embodiments, the plurality of first line portions 210c may be formed in the second metal layer M2. The plurality of second line portions 220c may be formed in the third metal layer M3. The plurality of first line portions 210c may be formed across at least two test target pads 1203_1 and 1203_2. The plurality of first line portions 210c may be electrically connected to the plurality of second line portions 220c through vias 230c. One of the vias 230c may connect one of the plurality of first line portions 210c and one the plurality of second line portions 220c by penetrating the second insulating layer I2.

In some example embodiments, one of the plurality of first line portions 210c may be connected to a first line portion corresponding to another test target pad through connection line portions 241c and 242c. The first connection line portion 241c may be formed in the third metal layer M3. The second connection line portion 242c may be formed in the second metal layer M2. One end of the first connection line portion 241c may be connected to one of the plurality of first line portions 210c through one of the vias 230c. The other end of the first connection line portion 241c may be connected to the second connection line portion 242c through one of the vias 230c.

Figure 16:
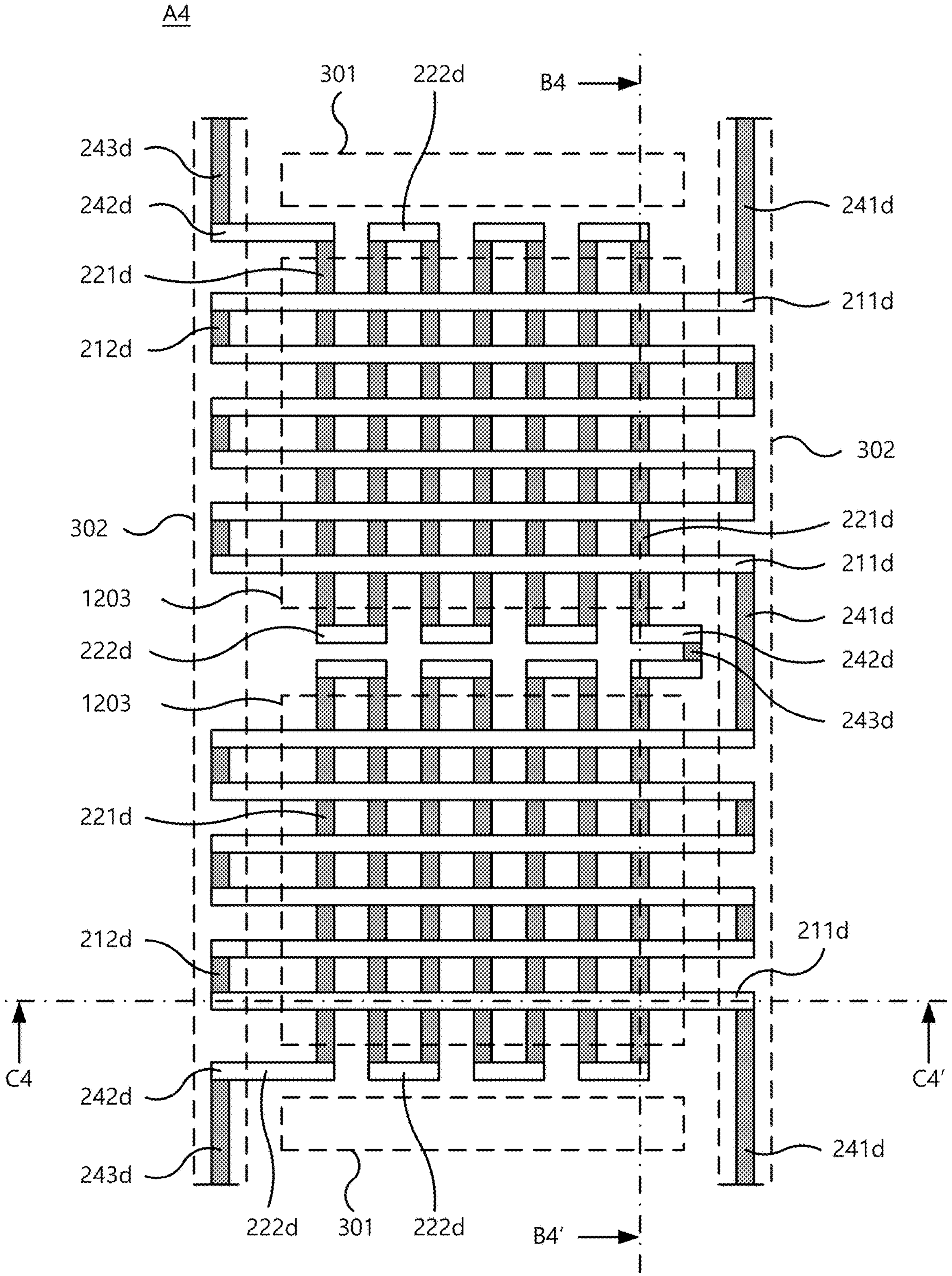
FIG. 16 is a diagram illustrating another example of A in FIG. 6.
Figure 17:
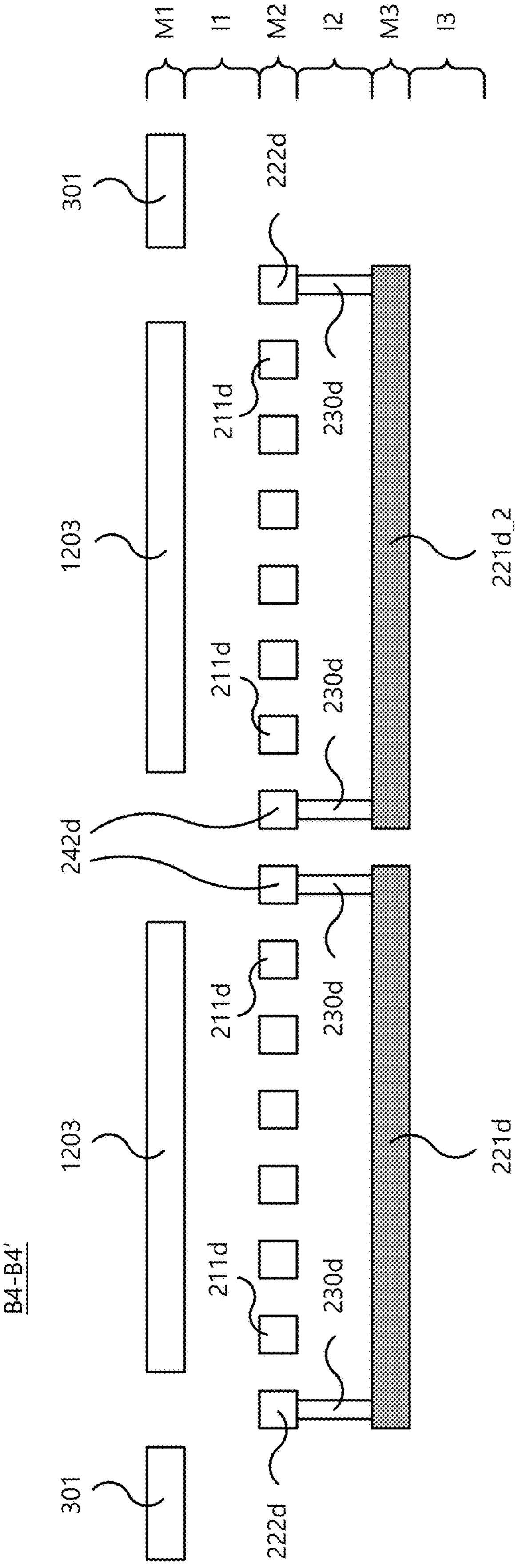
FIG. 17 is a cross section view illustrating according to B4-B4' of FIG. 16.
Figure 18:
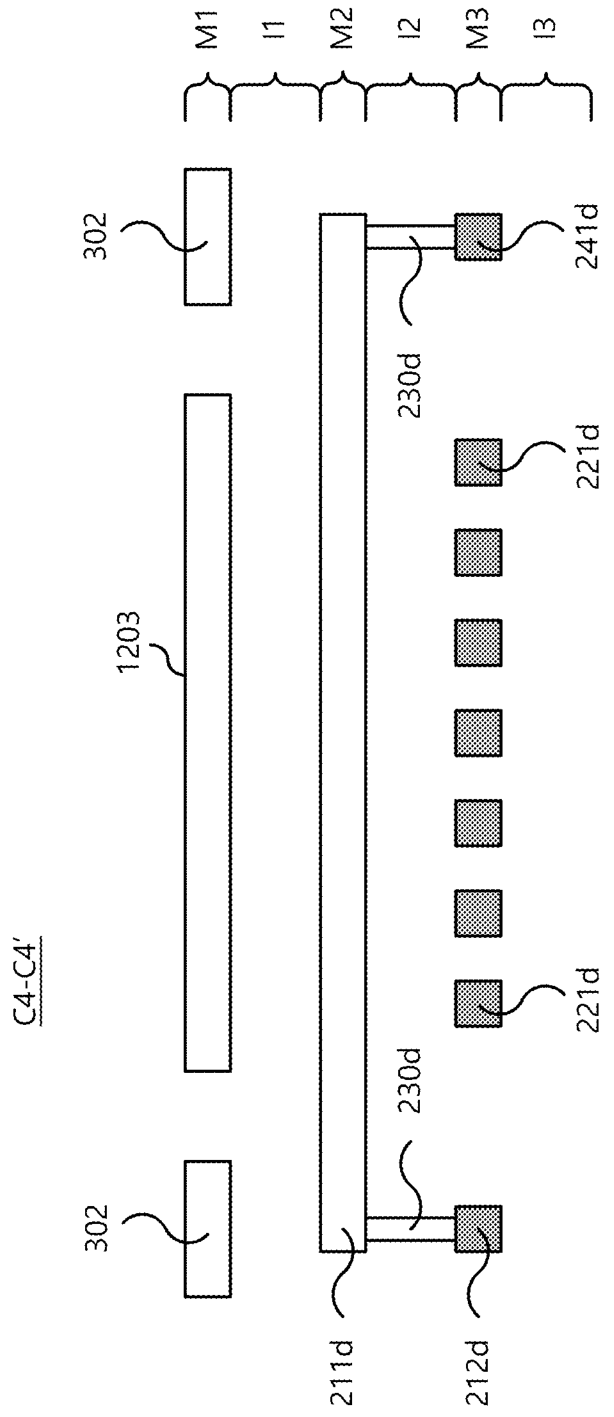
FIG. 18 is a cross section view illustrating according to C4-C4' of FIG. 16.

FIG. 16 is a diagram illustrating another example of A in FIG. 6. FIG. 17 is a cross section view illustrating according to B4-B4' of FIG. 16. FIG. 18 is a cross section view illustrating according to C4-C4' of FIG. 16. Referring to FIGS. 16 to 18, the memory device 1200 may include a first metal layer M1, a second metal layer M2, and a third metal layer M3. In addition, the memory device 1200 may include a first insulating layer I1 disposed between the first metal layer M1 and the second metal layer M2, a second insulating layer I2 disposed between the second metal layer M2 and the third metal layer M3, and a third insulating layer I3 disposed below the third metal layer M3.

In some example embodiments, test target pads 1203 and power buses 301 and 302 may be formed in the first metal layer M1. For example, the power buses 301 and 302 may be formed around the test target pads 1203. The first power buses 301 may be arranged in a first direction between the test target pads 1203. The second power buses 302 may be arranged to extend in a second direction in which the test target pads 1203 are arranged. The test target pads 1203 may be exposed to the outside of the package of the memory device 1200.

In some example embodiments, the crack detection structure 200 may detect whether the test target pads 1203 contain cracks through two paths. The two paths of the crack detection structure 200 may be arranged in different directions. The two paths of crack detection structure 200 may be placed in different metal layers. Accordingly, the crack detection structure 200 may detect whether the test target pads 1203 contain cracks more accurately than when the crack detection structure 200 has a single path.

In some example embodiments, the first path of the crack detection structure 200 may include a plurality of first line portions 211d and a plurality of second line portions 212d. The plurality of first line portions 211d may extend in the first direction. The plurality of first line portions 211d may be arranged parallel to the first power buses 301. The plurality of second line portions 212d may be disposed between the plurality of first line portions 211d in the second direction. The plurality of first line portions 211d may be formed in the second metal layer M2. The plurality of second line portions 212d may be formed in the third metal layer M3. The plurality of first line portions 211d may be electrically connected to the plurality of second line portions 212d through vias 230d penetrating the second insulating layer I2.

In some example embodiments, the second path of the crack detection structure 200 may include a plurality of third line portions 221d and a plurality of fourth line portions 222d. The plurality of third line portions 221d may extend in the second direction. The plurality of third line portions 221d may be arranged parallel to the second power buses 302. The plurality of fourth line portions 222d may be disposed between the plurality of third line portions 221d in the second direction. The plurality of third line portions 221d may be formed in the third metal layer M3. The plurality of fourth line portions 222d may be formed in the second metal layer M2. The plurality of third line portions 221d may be electrically connected to the plurality of fourth line portions 222d through one of the vias 230d penetrating the second insulating layer I2.

In some example embodiments, one of the plurality of first line portions 211d may be connected to a first line portion corresponding to another test target pad through a first connection line portion 241d. One end of the first connection line portion 241d may be connected to one of the plurality of first line portions 211d corresponding to one test target pad through one of the vias 230d. The other end of the first connection line portion 241d may be connected to one of the plurality of first line portions 211d corresponding to another test target pad through one of the vias 230d.

In some example embodiments, one of the plurality of third line portions 221d may be connected to a third line portion corresponding to another test target pad through a second connection line portion 242*d* and a third connection line portion 243*d*. One end of the second connection line portion 242*d* may be connected to one of the plurality of third line portions 221*d* corresponding to one test target pad through one of the vias 230*d*. The other end of the second connection line portion 242*d* may be connected to one end of the third connection line portion 243*d* through one of the vias 230*d*. The other end of the third connection line portion 243*d* may be connected to one end of another second connection line portion 242*d* through one of the vias 230*d*. The other end of the another second connection line portion 242*d* may be connected to one of the plurality of third line portions 221*d* corresponding to the other test target pad through one of the vias 230*d*.

Figure 19:
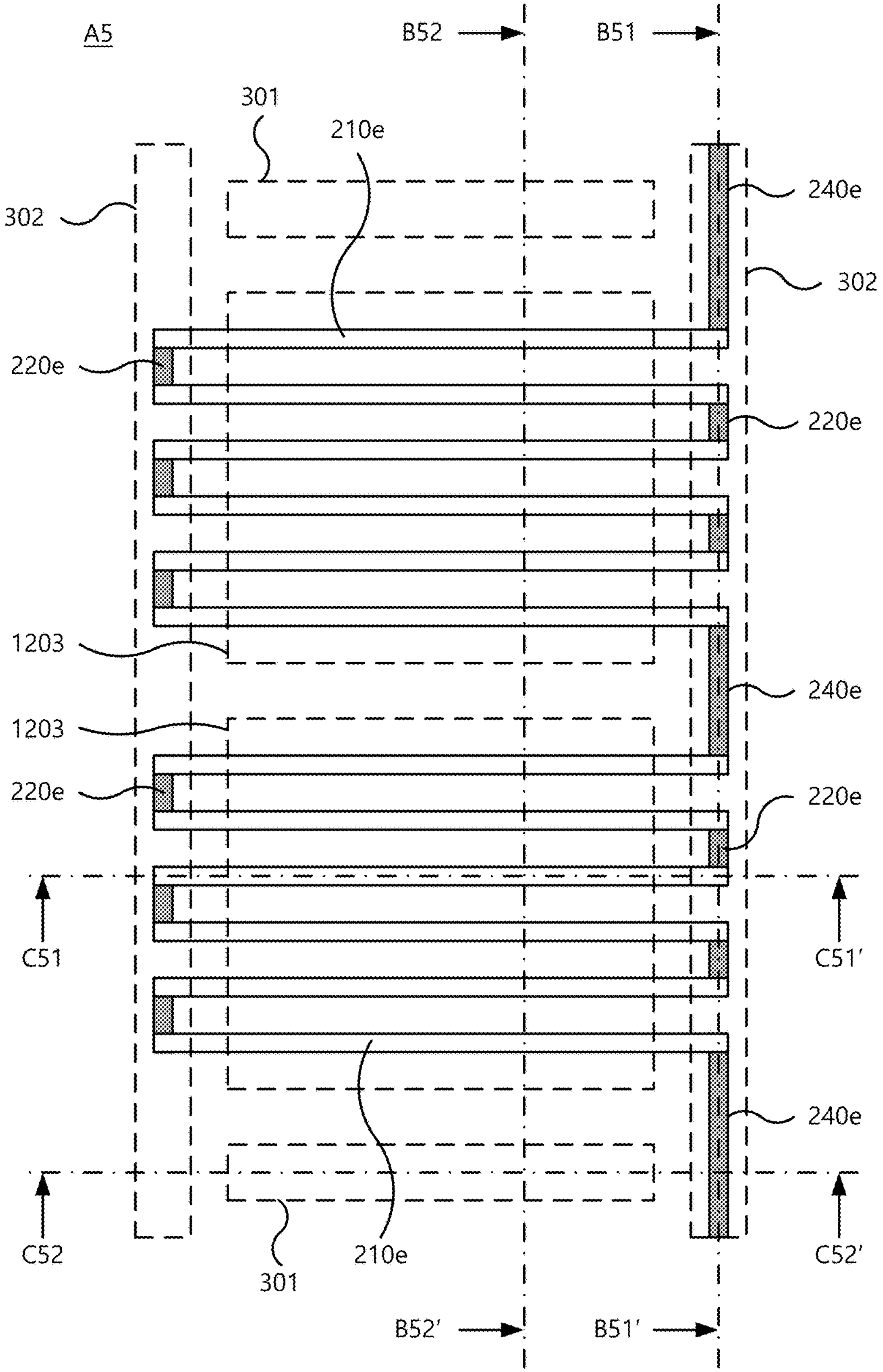
FIG. 19 is a diagram illustrating another example of A in FIG. 6.
Figure 20:
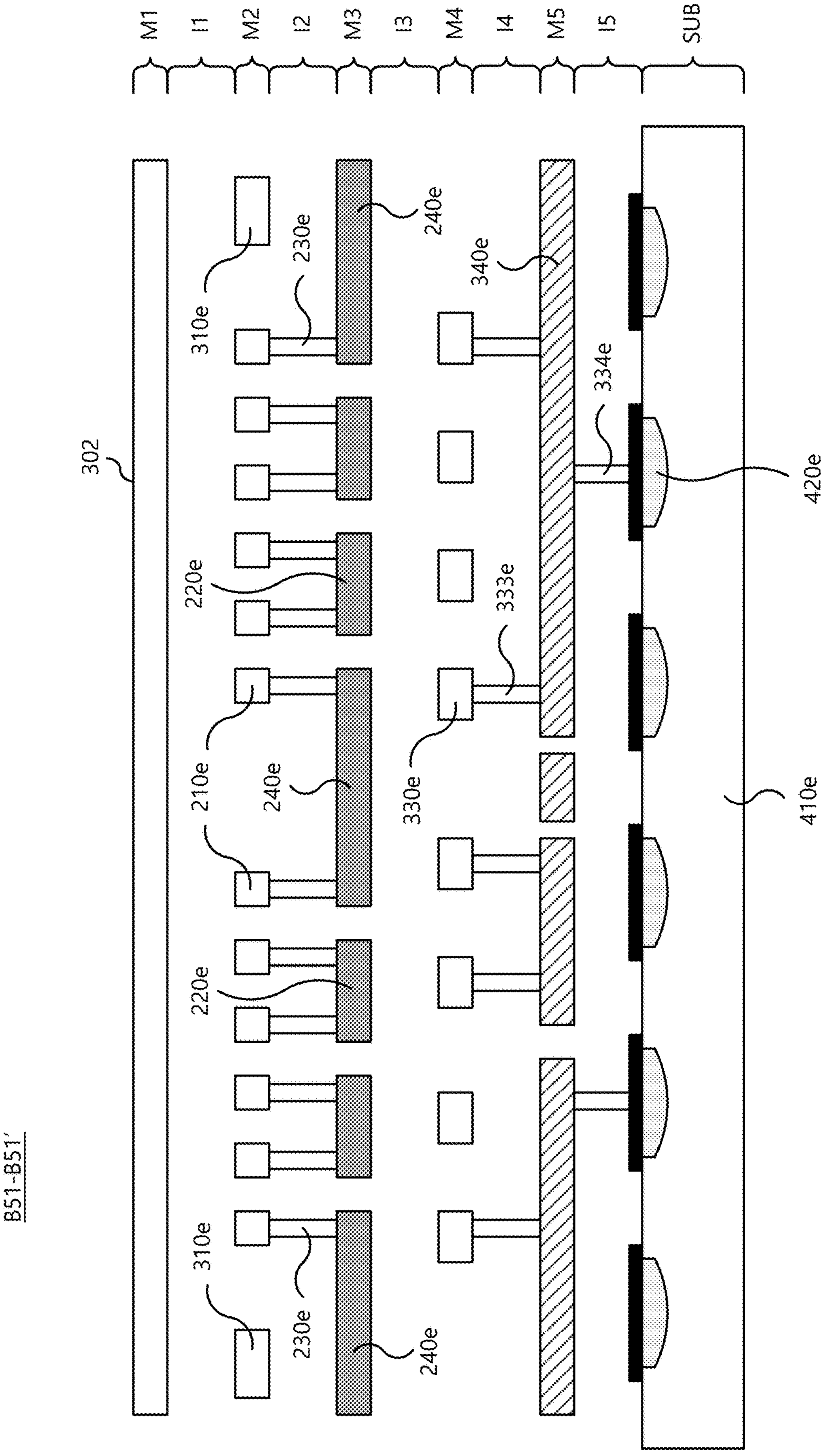
FIG. 20 is a cross section view illustrating according to B51-B51' of FIG. 19.
Figure 21:
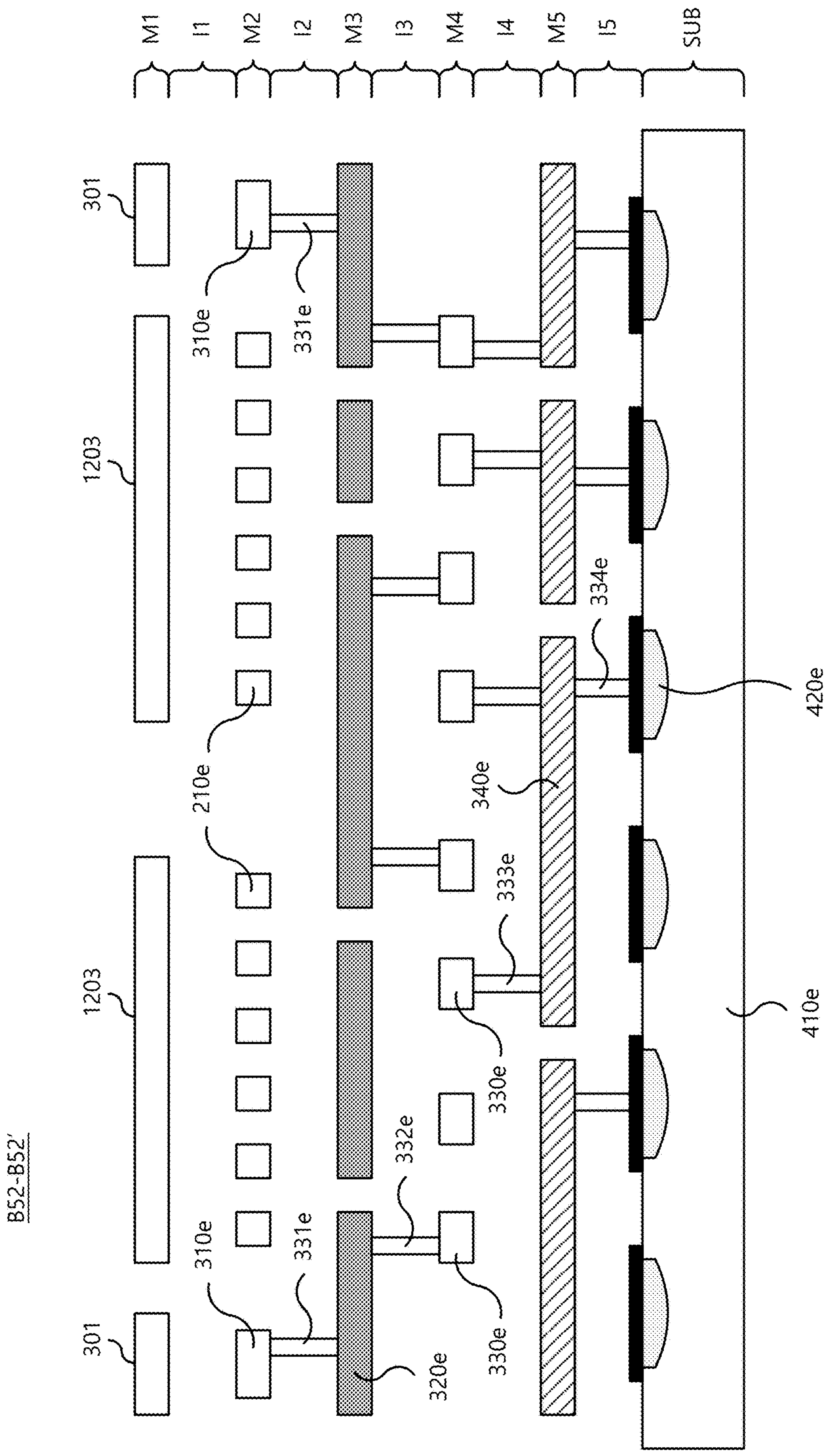
FIG. 21 is a cross section view illustrating according to B52-B52' of FIG. 19.
Figure 22:
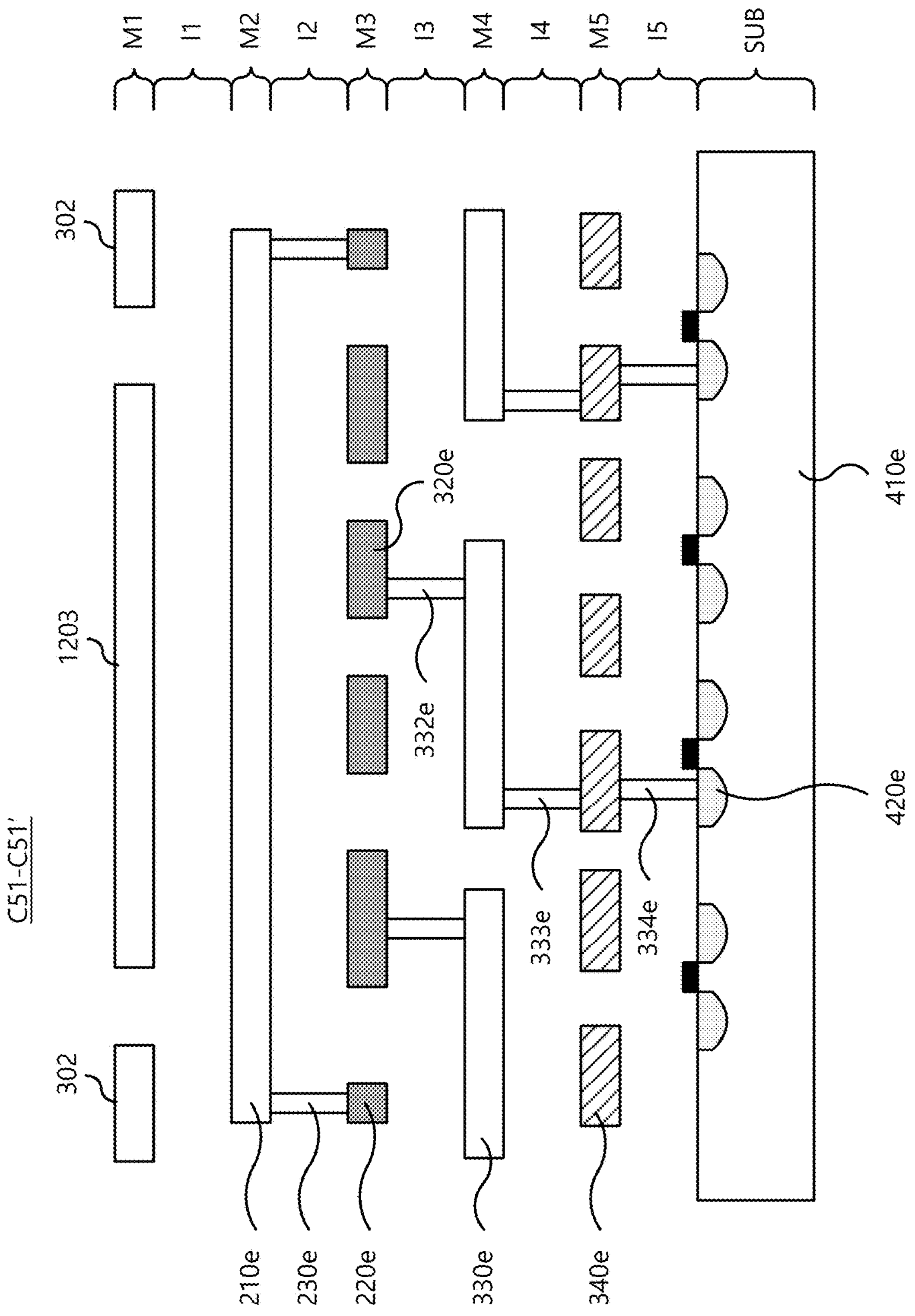
FIG. 22 is a cross section view illustrating according to C51-C51' of FIG. 19.
Figure 23:
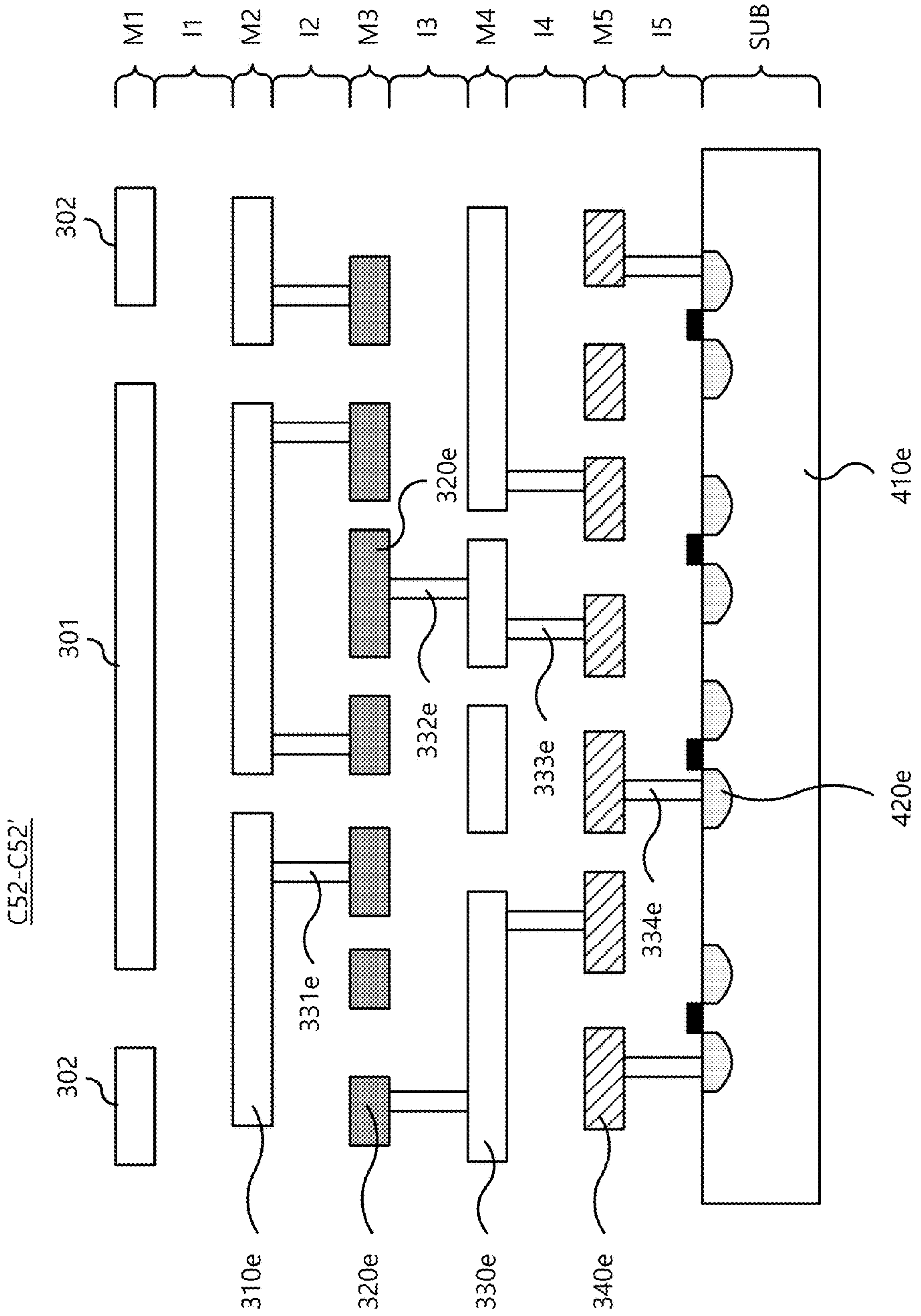
FIG. 23 is a cross section view illustrating according to C52-C52' of FIG. 19.

FIG. 19 is a diagram illustrating another example of A in FIG. 6. FIG. 20 is a cross section view illustrating according to B51-B51' of FIG. 19. FIG. 21 is a cross section view illustrating according to B52-B52' of FIG. 19. FIG. 22 is a cross section view illustrating according to C51-C51' of FIG. 19. FIG. 23 is a cross section view illustrating according to C52-C52' of FIG. 19. Referring to FIGS. 19 to 23, the memory device 1200 may include a first metal layer M1, a second metal layer M2, a third metal layer M3, a fourth metal layer M4, and a fifth metal layer M5. In addition, the memory device 1200 may include a first insulating layer I1 disposed between the first metal layer M1 and the second metal layer M2, a second insulating layer I2 disposed between the second metal layer M2 and the third metal layer M3, a third insulating layer I3 disposed between the third metal layer M3 and the fourth metal layer M4, a fourth insulating layer I4 disposed between the fourth metal layer M4 and the fifth metal layer M5, and a fifth insulating layer I5 disposed below the fifth metal layer M5. The first to fifth metal layers M1, M2, M3, M4 and M5 and the first to fifth insulating layers I1, I2, I3, I4 and I5 may be stacked on the substrate 410*e*.

In some example embodiments, test target pads 1203 and power buses 301 and 302 may be formed in the first metal layer M1. For example, the power buses 301 and 302 may be formed around the test target pads 1203. The first power buses 301 may be arranged in a first direction between the test target pads 1203. The second power buses 302 may be arranged to extend in a second direction in which the test target pads 1203 are arranged. The test target pads 1203 may be exposed to the outside of the package of the memory device 1200.

In some example embodiments, the crack detection structure 200 may include a plurality of first line portions 210*e* and a plurality of second line portions 220*e*. The plurality of first line portions 210*e* may extend in the first direction. The plurality of first line portions 210*e* may be arranged to be parallel to the first power buses 301. The plurality of second line portions 220*e* may be disposed between the plurality of first line portions 210*e* in the second direction. The plurality of second line portions 220*e* may be arranged parallel to the second power buses 302.

In some example embodiments, the plurality of first line portions 210*e* may be formed in the second metal layer M2. The plurality of second line portions 220*e* may be formed in the third metal layer M3. The plurality of first line portions 210*e* may be electrically connected to the plurality of second line portions 220*e* through vias 230*e*. The vias 230*e* may connect the plurality of first line portions 210*e* and the plurality of second line portions 220*e* by penetrating the second insulating layer I2.

In some example embodiments, one of the plurality of first line portions 210*e* may be connected to a first line portion corresponding to another test target pad through the connection line portion 240*e*. The connection line portion 240*e* may be formed in the third metal layer M3. One end of the connection line portion 240*e* may be connected to one of the plurality of first line portions 210*e* corresponding to one test target pad through one of vias 230*e*. The other end of the connection line portion 240*e* may be connected to one of the plurality of first line portions 210*e* corresponding to another test target pad through one of vias 230*e*.

In some example embodiments, the memory device 1200 may include a plurality of general lines 310*e*, 320*e*, 330*e*, and 340*e*. The crack detection structure 200 may be disposed around the plurality of general lines 310*e*, 320*e*, 330*e*, and 340*e*. For example, the plurality of first line portions 210*e* may be formed in the second metal layer M2 like the first general lines 310*e*. The plurality of second line portions 220*e* may be formed in the third metal layer M3 like the second general lines 320*e*. The third general lines 330*e* may be formed below the plurality of second line portions 220*e* in the fourth metal layer M4. The fourth general lines 340*e* may be formed below the plurality of second line portions 220*e* in the fifth metal layer M5.

In some example embodiments, the first general lines 310*e* may be connected to the second general lines 320*e* through first general vias 331*e*. The second general lines 320*e* may be connected to the third general lines 330*e* through second general vias 332*e*. The third general lines 330*e* may be connected to the fourth general lines 340*e* through third general vias 333*e*. The fourth general lines 340*e* may be connected to semiconductor devices 420*e* (for example, transistor) on the substrate 410*e* through fourth general vias 334*e*.

As described above, the crack detection structure 200 may be formed on the second metal layer M2 and the third metal layer M3 where the general lines are already placed. Accordingly, the memory device 1200 does not require an additional metal layer for the crack detection structure 200.

Figure 24:
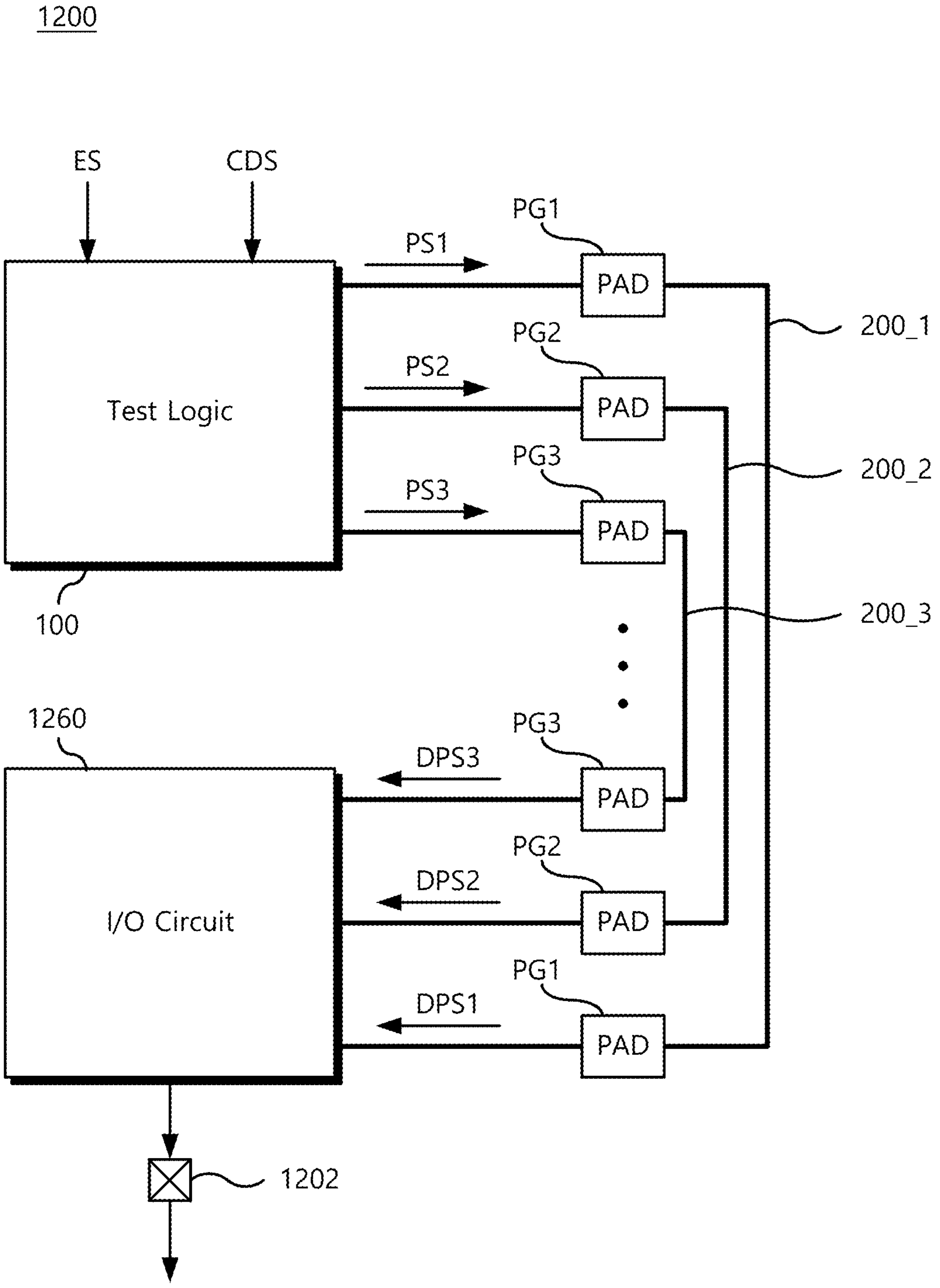
FIG. 24 is a diagram illustrating a crack detection structure for performing a crack detection operation on each group of test target pads in the memory device of FIG. 2.

FIG. 24 is a diagram illustrating a crack detection structure for performing a crack detection operation on each group of test target pads in the memory device of FIG. 2. Referring to FIG. 24, a crack detection operation may be performed on test target pads for each of the plurality of pad groups PG1, PG2 and PG3. Each of the plurality of crack detection structures 200_1, 200_2 and 200_3 may include the characteristics of the crack detection structures described in FIGS. 7 to 23.

In some example embodiments, the first crack detection structure 200_1 may be arranged in series below the first pad group PG1. The second crack detection structure 200_2 may be arranged in series below the second pad group PG2. The third crack detection structure 200_3 may be arranged in series below the third pad group PG3.

In some example embodiments, a test logic 100 may transmit a first test pulse signal PS1 to the first crack detection structure 200_1. The test logic 100 may transmit a second test pulse signal PS2 to the second crack detection structure 200_2. The test logic 100 may transmit a third test pulse signal PS3 to the third crack detection structure 200_3. The first test pulse signal PS1, the second test pulse signal PS2 and the third test pulse signal PS3 may be the same pulse signal.

As an example, an input/output circuit 1260 may receive a first delay pulse signal DPS1, a second delay pulse signal DPS2 and a third delay pulse signal DPS3. The input/output circuit 1260 may output the first delayed pulse signal DPS1, the second delayed pulse signal DPS2 and the third delayed pulse signal DPS3 through a data pad 1202. As another example, the first delay pulse signal DPS1, the second delay pulse signal DPS2 and the third delay pulse signal DPS3 may be output directly through the data pad 1202 without going through the input/output circuit 1260.

As described above, the memory device 1200 may output the plurality of delay pulse signals DPS1, DPS2, and DPS3 respectively corresponding to the plurality of pad groups PG1, PG2, and PG3. Accordingly, the test device 10 may confirm a location of a test target pad where a crack occurs based on the plurality of delay pulse signals DPS1, DPS2 and DPS3.

Figure 25:
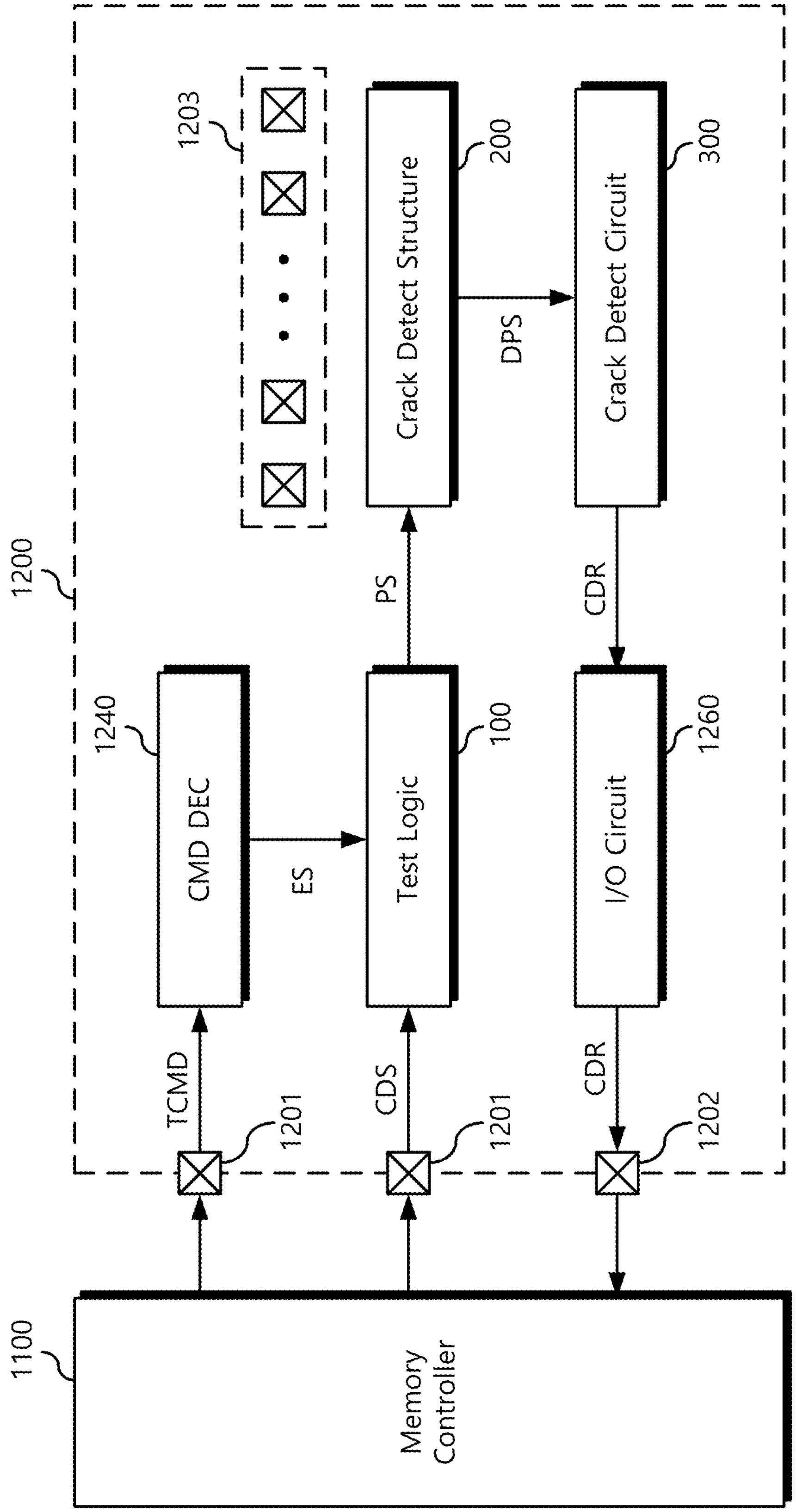
FIG. 25 is a block diagram illustrating another example of a crack detection operation of test target pads included in a memory device of FIG. 2.

FIG. 25 is a block diagram illustrating another example of a crack detection operation of test target pads included in a memory device of FIG. 2. Referring to FIGS. 2 and 25, a memory controller 1100 may transmit a test command TCMD to a memory device 1200 and receive a response (for example, a crack detection result signal CDR) to the test command TCMD to detect whether test target pads 1203 contain cracks.

In some example embodiments, the memory device 1200 may include a test logic 100 and a crack detection structure 200 to detect cracks in a plurality of pads included in the memory device 1200. In addition, the memory device 1200 may include a crack detection circuit 300 which determines whether the test target pads 1203 contain cracks.

In some example embodiments, the memory controller 1100 may transmit the test command TCMD through the command pad 1201. In addition, the memory controller 1100 may transmit a crack detection signal CDS with a specified delay through the command pad 1201. The command decoder 1240 may transmit a test enable signal ES to the test logic 100 when receiving the test command TCMD. In some example embodiments, when receiving the test enable signal ES, the test logic 100 may generate a test pulse signal PS by combining the test enable signal ES and the crack detection signal CDS. The test pulse signal PS may pass through the crack detection structure 200 and be converted into a delay pulse signal DPS due to a resistance of the crack detection structure 200.

In some example embodiments, the crack detection circuit 300 may check whether the test target pads 1203 contain cracks based on the delay pulse signal DPS. The crack detection circuit 300 may generate a crack detection result signal CDR corresponding to the delay pulse signal DPS. For example, when the test target pads 1203 do not contain cracks, the delay pulse signal DPS may have a first delay value. In some example embodiments, when the test target pads 1203 include cracks, the delay pulse signal DPS may have a second delay value greater than the first delay value. In some example embodiments, when receiving the delay pulse signal DPS including the first delay value, the crack detection circuit 300 may output a first crack detection result. In some example embodiments, when receiving the delay pulse signal DPS including the second delay value, the crack detection circuit 300 may output a second crack detection result.

In some example embodiments, the crack detection circuit 300 may check a normal distribution corresponding to the delay pulse signal DPS having a specified distribution. The crack detection circuit 300 may determine that the test target pads 1203 contain cracks when the delay value of the received delay pulse signal DPS deviates from the normal distribution. In some example embodiments, when the delay value deviates from the normal distribution, it may mean that the delay value differs from the average of the normal distribution by more than a certain level (for example, a predetermined multiple of the standard deviation of the normal distribution). As an example, the crack detection circuit 300 may determine that the test target pads 1203 contain cracks when the delay value of the received delay pulse signal DPS deviates from the average of the normal distribution by a specified size or more.

In some example embodiments, the crack detection circuit 300 may transmit the crack detection result signal CDR to the input/output circuit 1260. The crack detection result signal CDR may be transmitted to the memory controller 1100 through the input/output circuit 1260 and the data pad 1202. The memory controller 1100 may check whether a pad containing a crack is present among the test target pads 1203 based on the crack detection result signal CDR (for example, the first crack detection result or the second crack detection result).

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to some example embodiments of inventive concepts, it may be possible to detect whether cracks occur in pads included in the memory device.

While the present inventive concepts have been described with reference to example embodiments thereof, it will be apparent to those of ordinary skill in the art that various changes and modifications may be made thereto without departing from the spirit and scope of the present inventive concepts as set forth in the following claims.

What is claimed is:

1. A memory device comprising:

a memory cell array;

a first pad configured to receive a command from an external device;

a second pad configured to exchange data with the external device;

a third pad;

a test logic configured to generate a test pulse signal by combining a test enable signal generated based on a test command received through the first pad and a crack detection signal having a specified delay; and a crack detection structure arranged below the third pad and configured to include lines connected in series from the test logic to the second pad, wherein a crack occurring in the third pad is detected based on a delay of a delay pulse signal changed when the test pulse signal passes through the crack detection structure.

2. The memory device of claim 1, wherein the crack detection structure comprises:

first line portions crossing the third pad in a first direction;

second line portions connecting the first line portions; and a via connecting one of the first line portions and one of the second line portions.

3. The memory device of claim 2, wherein the third pad is on a first metal layer, wherein the first line portions are on a second metal layer stacked below the first metal layer, wherein the second line portions are on a third metal layer stacked below the second metal layer, wherein the first metal layer and the second metal layer are separated by a first insulating layer, and wherein the via is configured to penetrate a second insulating layer stacked between the second metal layer and the third metal layer and connect one of the first line portions and one of the second line portions.

4. The memory device of claim 2, wherein a length of each of the first line portions is configured to be longer than a length of each of the second line portions.

5. The memory device of claim 2, wherein the first line portions are arranged in parallel and spaced apart at specified intervals.

6. The memory device of claim 1, wherein the crack detection structure comprises:

a first line portion curved in a plurality of directions to overlap the third pad vertically;

a second line portion connected to one end of the first line portion through a first via; and a third line portion connected to another end of the first line portion through a second via.

7. The memory device of claim 1, wherein it is determined that a crack exists in the third pad when the delay of the delay pulse signal is greater than a reference value.

8. The memory device of claim 1, wherein it is determined that a crack exists in the third pad when an edge slope of the delay pulse signal is less than a reference value.

9. The memory device of claim 1, further comprising:

a command decoder configured to output the test enable signal based on the test command, wherein the crack detection signal is received through the first pad.

10. The memory device of claim 1, further comprising:

an input/output circuit configured to perform input or output of data stored in the memory cell array, wherein the input/output circuit is configured to output the delay pulse signal through the second pad.

11. A method of detecting cracks in a memory device, the method comprising:

transmitting a test command from a test device to the memory device;

generating a test pulse signal by combining a test enable signal generated based on the test command and a crack detection signal having a specified delay;

transmitting the test pulse signal through a crack detection structure arranged below a test target pad;

outputting a delay pulse signal which has passed through the crack detection structure to the test device through a data pad of the memory device; and comparing the test pulse signal and the delay pulse signal to determine whether the test target pad contains a crack based on a delay of the delay pulse signal.

12. The method of claim 11, wherein the determining whether the test target pad contains a crack includes determining that the crack exists in the test target pad when the delay of the delay pulse signal is greater than a reference value.

13. The method of claim 11, wherein the determining whether the test target pad contains a crack includes determining that the crack exists in the test target pad when an edge slope of the delay pulse signal is less than a reference value.

14. The method of claim 11, wherein the determining whether the test target pad contains a crack includes determining that the crack exists in the test target pad when a delay value of the delay pulse signal deviates from a normal distribution.

15. The method of claim 11, wherein the crack detection structure comprises:

first line portions crossing the test target pad in a first direction;

second line portions configured to connect between the first line portions; and a via configured to connect one of the first line portions and one of the second line portions.

16. The method of claim 11, wherein the crack detection structure comprises:

a first line portion curved in a plurality of directions to overlap the test target pad vertically;

a second line portion connected to one end of the first line portion through a first via; and a third line portion connected to another end of the first line portion through a second via.

17. A memory device comprising:

test target pads;

a test logic configured to generate a test pulse signal by combining a test enable signal generated based on a test command received from an external device and a crack detection signal having a specified delay;

a crack detection structure arranged below the test target pads and including lines connected in series across the test target pads; and a crack detection circuit configured to determine whether cracks occur in the test target pads based on a delay of a delay pulse signal changed when the test pulse signal passes through the crack detection structure.

18. The memory device of claim 17, further comprising:

a first metal layer on which the test target pads are arranged;

a first insulating layer stacked below the first metal layer;

a second metal layer stacked below the first insulating layer;

a second insulating layer stacked below the second metal layer; and a third metal layer stacked below the second insulating layer.

19. The memory device of claim 18, wherein the crack detection structure comprises:

first line portions formed on the second metal layer and overlapped by a specified ratio or more of areas of each of the test target pads; and second line portions arranged on the third metal layer and connected to the first line portions through vias penetrating the second insulating layer such that the first line portions are connected in series.

20. The memory device of claim 19, wherein the first line portions are configured to be arranged across at least two of the test target pads in a direction in which the test target pads are arranged, and the first line portions arranged in parallel and spaced apart at a specified interval.

* * * * *